US011267392B2

(12) United States Patent
Tan et al.

(10) Patent No.: US 11,267,392 B2
(45) Date of Patent: Mar. 8, 2022

(54) LIGHT-EMITTING SYSTEM

(71) Applicant: PIONEER CORPORATION, Tokyo (JP)

(72) Inventors: Hiroki Tan, Yonezawa (JP); Teruichi Watanabe, Yonezawa (JP); Isamu Ohshita, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 898 days.

(21) Appl. No.: 15/770,598

(22) PCT Filed: Oct. 20, 2016

(86) PCT No.: PCT/JP2016/081153
§ 371 (c)(1),
(2) Date: Apr. 24, 2018

(87) PCT Pub. No.: WO2017/073459
PCT Pub. Date: May 4, 2017

(65) Prior Publication Data
US 2019/0054853 A1 Feb. 21, 2019

(30) Foreign Application Priority Data

Oct. 27, 2015 (JP) .............................. JP2015-210775

(51) Int. Cl.
*B60Q 1/34* (2006.01)
*B60Q 1/44* (2006.01)
(Continued)

(52) U.S. Cl.
CPC ............... *B60Q 1/34* (2013.01); *B60Q 1/268* (2013.01); *B60Q 1/44* (2013.01); *B60Q 3/74* (2017.02);
(Continued)

(58) Field of Classification Search
CPC . H01L 51/50; H01L 51/5064; H01L 51/5203; H01L 51/5271; H01L 51/5275; B60Q 1/24; B60Q 1/44; B60Q 3/74
See application file for complete search history.

(56) References Cited

U.S. PATENT DOCUMENTS 8,420,423 B2 * 4/2013 Choi ................... H01L 51/5265
438/39
9,755,001 B2 * 9/2017 Seo ......................... H01L 33/44
(Continued)

FOREIGN PATENT DOCUMENTS

JP H08-148283 A 6/1996
JP H11-198720 A 7/1999
(Continued)

OTHER PUBLICATIONS

Extended European Search Report for related European Application No. 16859689.8, dated Jun. 7, 2019; 9 pages.
(Continued)

Primary Examiner — Tung X Le
(74) Attorney, Agent, or Firm — Procopio, Cory, Hargreaves & Savitch LLP

(57) ABSTRACT

A partition member (20) partitions a space occupied by a person from the outside. The space is, for example, an interior of a mobile object (30) such as a vehicle. A substrate (100) is disposed on a surface of the partition member (20) on the space side and has optical transparency. On a surface (a second surface (110*b*)) of the substrate (100) on the space side, a plurality of light-emitting units and an insulating layer (150) are disposed. Each light-emitting unit (140) includes a light-transmitting first electrode (110), an organic layer (120), and a second electrode (130) in this order from the external side. The insulating layer (150) defines the plurality of light-emitting units (140). A third region (106: a light-transmitting region) in the substrate (100) in which the
(Continued)

second electrode (130) and the insulating layer (150) are not formed is provided between light-emitting units (140) next to each other.

19 Claims, 17 Drawing Sheets

(51) Int. Cl.
| | |
|---|---|
| H05B 33/28 | (2006.01) |
| B60Q 3/74 | (2017.01) |
| H05B 33/02 | (2006.01) |
| H01L 51/50 | (2006.01) |
| B60Q 1/26 | (2006.01) |
| H01L 27/32 | (2006.01) |
| H01L 51/52 | (2006.01) |
| F21V 33/00 | (2006.01) |
| F21S 2/00 | (2016.01) |
| H05B 33/04 | (2006.01) |
| H05B 33/06 | (2006.01) |

(52) U.S. Cl.
CPC .............. *F21S 2/005* (2013.01); *F21V 33/00* (2013.01); *H01L 27/326* (2013.01); *H01L 51/50* (2013.01); *H01L 51/5064* (2013.01); *H01L 51/5225* (2013.01); *H05B 33/02* (2013.01); *H05B 33/04* (2013.01); *H05B 33/06* (2013.01); *H05B 33/28* (2013.01); *H01L 2251/5361* (2013.01)

(56) References Cited

U.S. PATENT DOCUMENTS

| | | | | |
|---|---|---|---|---|
| 2007/0015429 | A1* | 1/2007 | Maeda | H01L 51/5206 445/24 |
| 2008/0061683 | A1* | 3/2008 | Bertram | H01L 51/5271 313/504 |
| 2009/0127564 | A1* | 5/2009 | Irikura | H01L 29/045 257/76 |
| 2011/0012117 | A1* | 1/2011 | Yamazaki | H01L 29/45 257/59 |
| 2015/0333288 | A1 | 11/2015 | Sugi et al. | |
| 2016/0268545 | A1* | 9/2016 | Sugizaki | H01L 51/5259 |

FOREIGN PATENT DOCUMENTS

| | | |
|---|---|---|
| JP | H11-273870 A | 10/1999 |
| JP | 2007-017410 A | 1/2007 |
| JP | 2008-112112 A | 5/2008 |
| JP | 2012-155146 A | 8/2012 |
| JP | 2014-072126 A | 4/2014 |
| JP | 2014-154404 A | 8/2014 |

OTHER PUBLICATIONS

International Search Report for related PCT Published Application No. PCT/JP2016/081153, dated Jan. 17, 2018. English translation provided; 4 pages.

* cited by examiner

FIG. 9
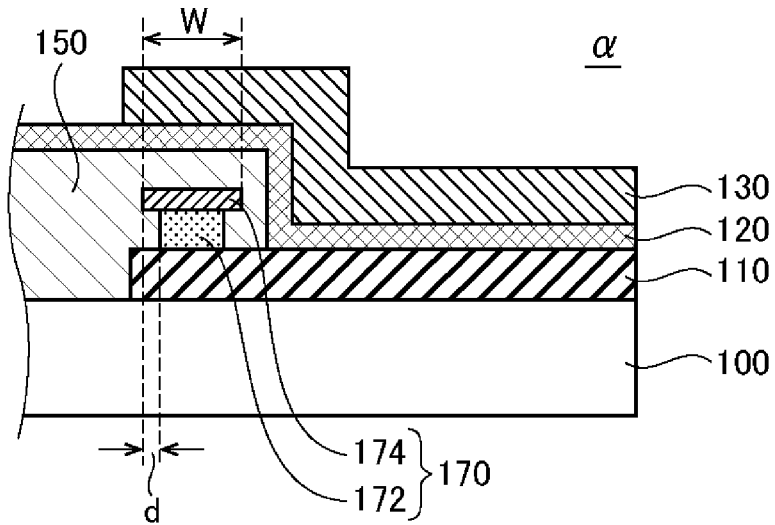
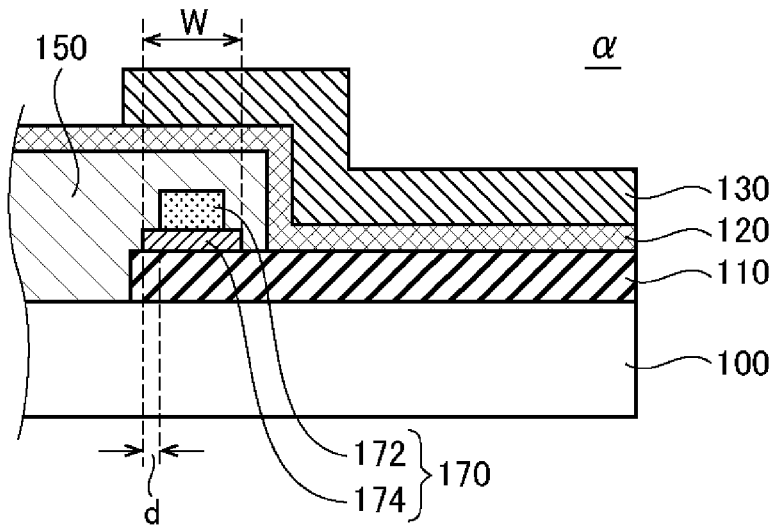
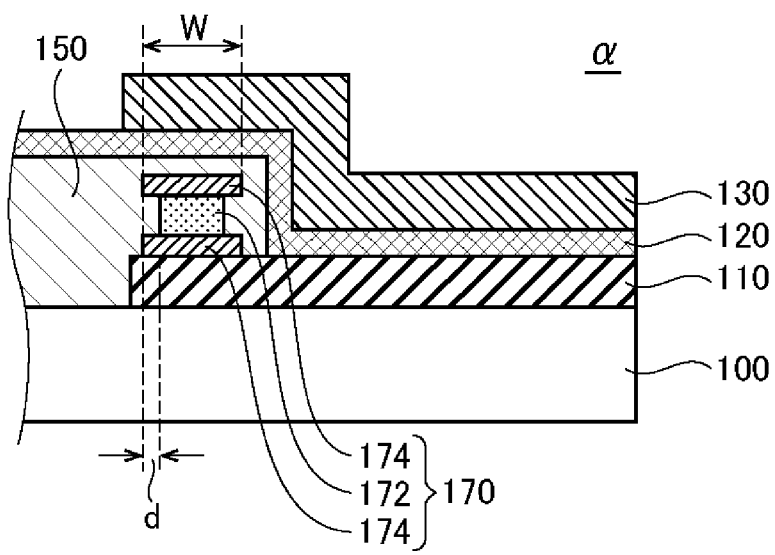

FIG. 18
(a)
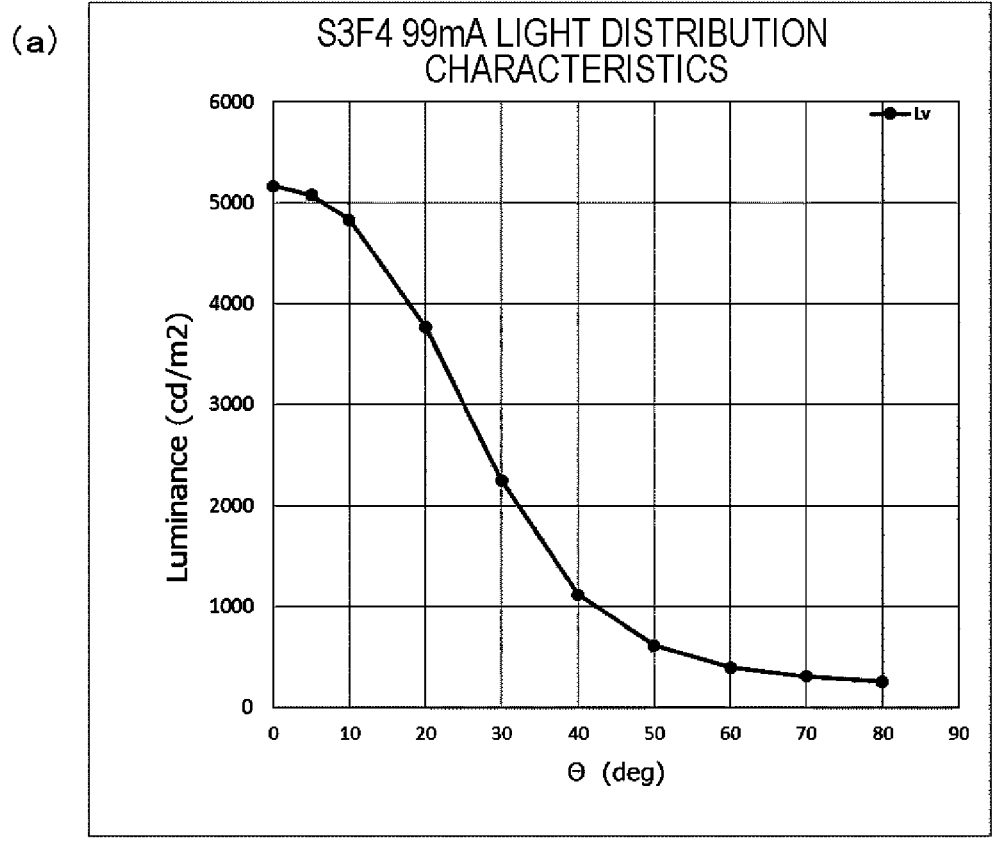
(b)
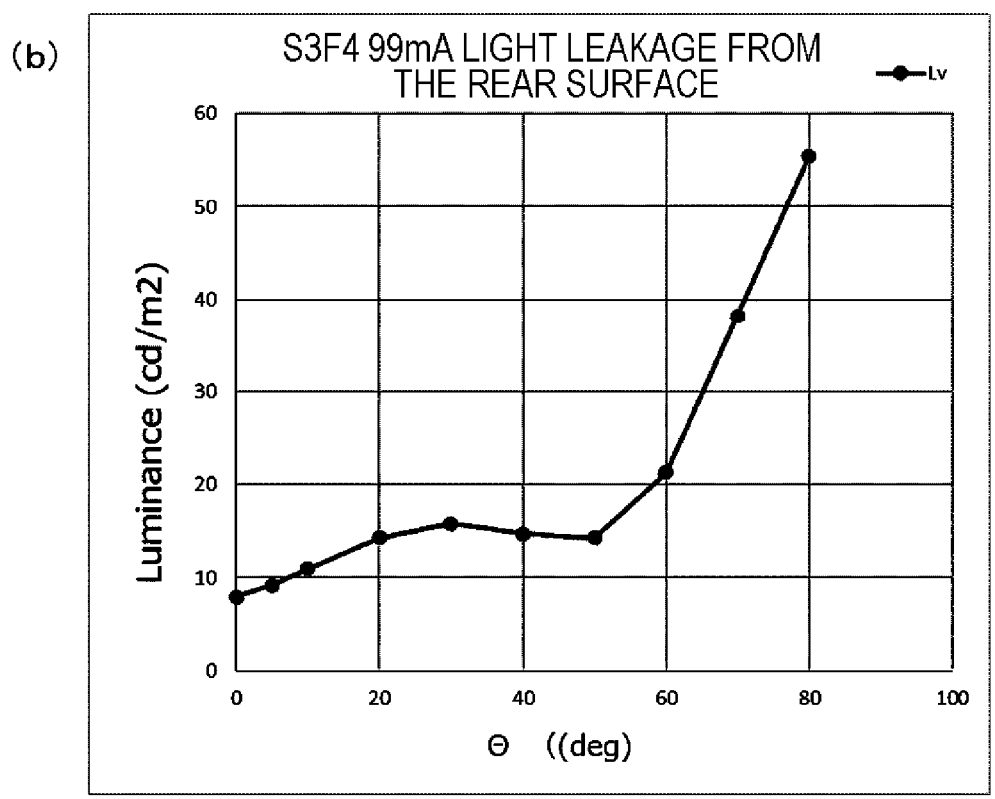

FIG. 19
(a) 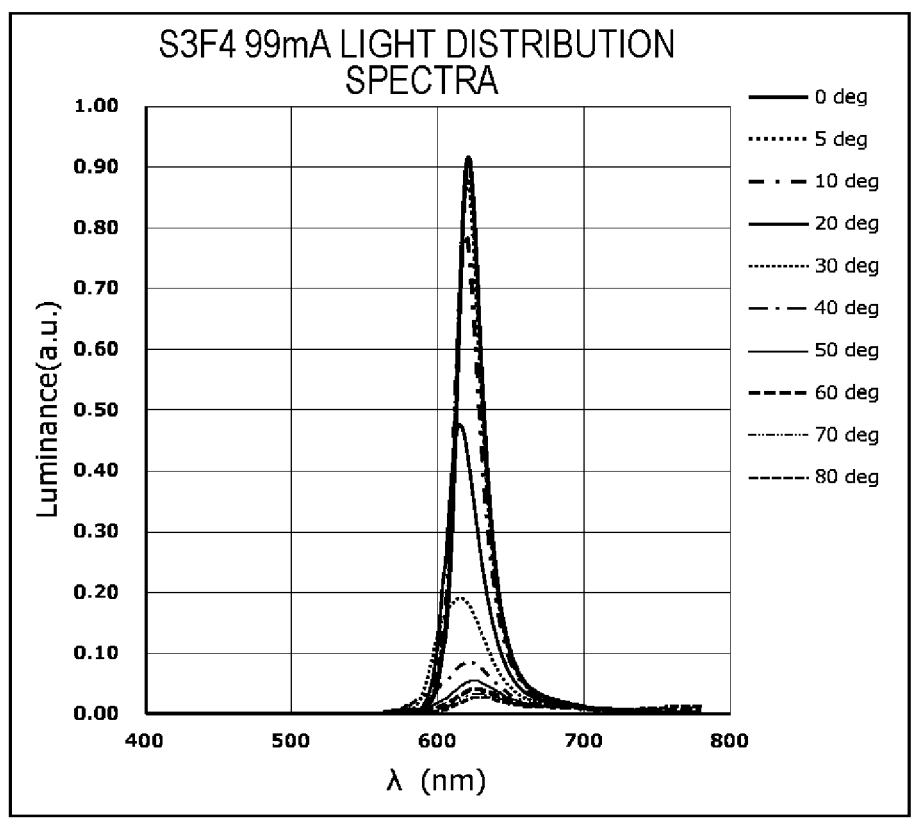
(b) 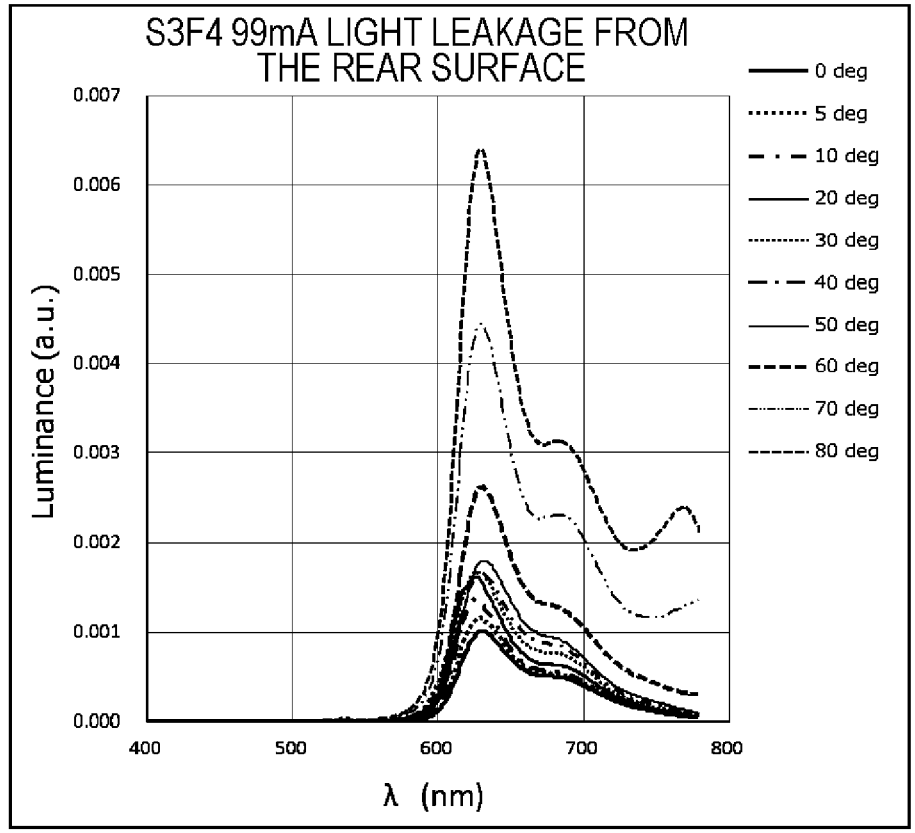

LIGHT-EMITTING SYSTEM

CROSS-REFERENCE TO RELATED APPLICATIONS

This application is a U.S. National Stage entry of PCT Application No: PCT/JP2016/081153 filed Oct. 20, 2016, which claims priority to Japanese Patent Application No. 2015-210775, filed Oct. 27, 2015, the contents of which are incorporated herein by reference.

TECHNICAL FIELD

The present invention relates to a light-emitting system.

BACKGROUND ART

In recent years, there has been progress in the development of light-emitting devices using organic EL. Such light-emitting devices are used as illumination devices or display devices and configured of an organic layer interposed between a first electrode and a second electrode. Generally, a light-transmitting material is used for the first electrode, and a metal material is used for the second electrode.

Further, Patent Document 1 discloses providing predetermined conditions to the shape of the second electrode in order to provide optical transparency to a light-emitting device using an organic EL.

RELATED ART DOCUMENT

Patent Document

[Patent Document 1]: Japanese Unexamined Patent Application Publication No. 2014-154404

SUMMARY OF THE INVENTION

Systems are being developed for emitting light toward the outside through a partition member, such as a window partitioning a space occupied by a person from the outside, by mounting a light-emitting member on the partition member. When emitting light to the outside, the light-emitting member is desirably prevented from blocking the visibility to the outside from inside the above-mentioned space.

An example of the problem to be solved by the present invention is to prevent, when mounting a light-emitting member on a partition member that partitions a space occupied by a person from the outside, the light-emitting member from blocking the visibility to the outside from inside the space.

Means for Solving the Problem

The invention described in claim 1 is a light-emitting system including:
a light-emitting device including a transmissive portion and a light-emitting unit, the device disposed on a light-transmitting partition member that partitions a first space and a second space,
wherein an intensity of light emitted to the second space is equal to or greater than 0% and equal to or less than 10% with respect to an intensity of light emitted to the first space.

The invention described in claim 5 is a light-emitting system including:
a light-transmitting partition member that partitions a first space and a second space;
a light-transmitting substrate disposed on a surface of the partition member on the second space side;
a plurality of light-emitting units disposed on the substrate; and
an insulating film that defines the plurality of light-emitting units,
wherein each light-emitting unit includes a light-transmitting first electrode, a light-emitting layer, and a second electrode in order from the first space side,
the light-emitting system further including a light-transmitting region in the substrate between two light-emitting units next to each other as a region in which the insulating film and the second electrode are not formed.

The invention described in claim 9 is a light-emitting system including:
a light-transmitting partition member that partitions a first space and a second space;
a plurality of light-transmitting units formed on the partition member; and
an insulating film that defines the plurality of light-emitting units,
wherein each light-emitting unit includes a light-transmitting first electrode, a light-emitting layer, and a second electrode in order from the first space side,
the light-emitting system further comprising a light-transmitting region in the partition member between two light-emitting units next to each other as a region in which the insulating film and the second electrode are not formed.

BRIEF DESCRIPTION OF THE DRAWINGS

The objects described above, and other objects, features and advantages are further made apparent by a suitable embodiment that will be described below and the following accompanying drawings.

FIG. 9 are each an enlarged view of a region of FIG. 8 surrounded by a dotted line a.

FIG. 18 are diagrams illustrating the characteristics of the light-emitting device according to the embodiment.

FIG. 19 are diagrams illustrating light emission characteristics of the light-emitting device according to the embodiment.

DESCRIPTION OF EMBODIMENTS

Figure 1:
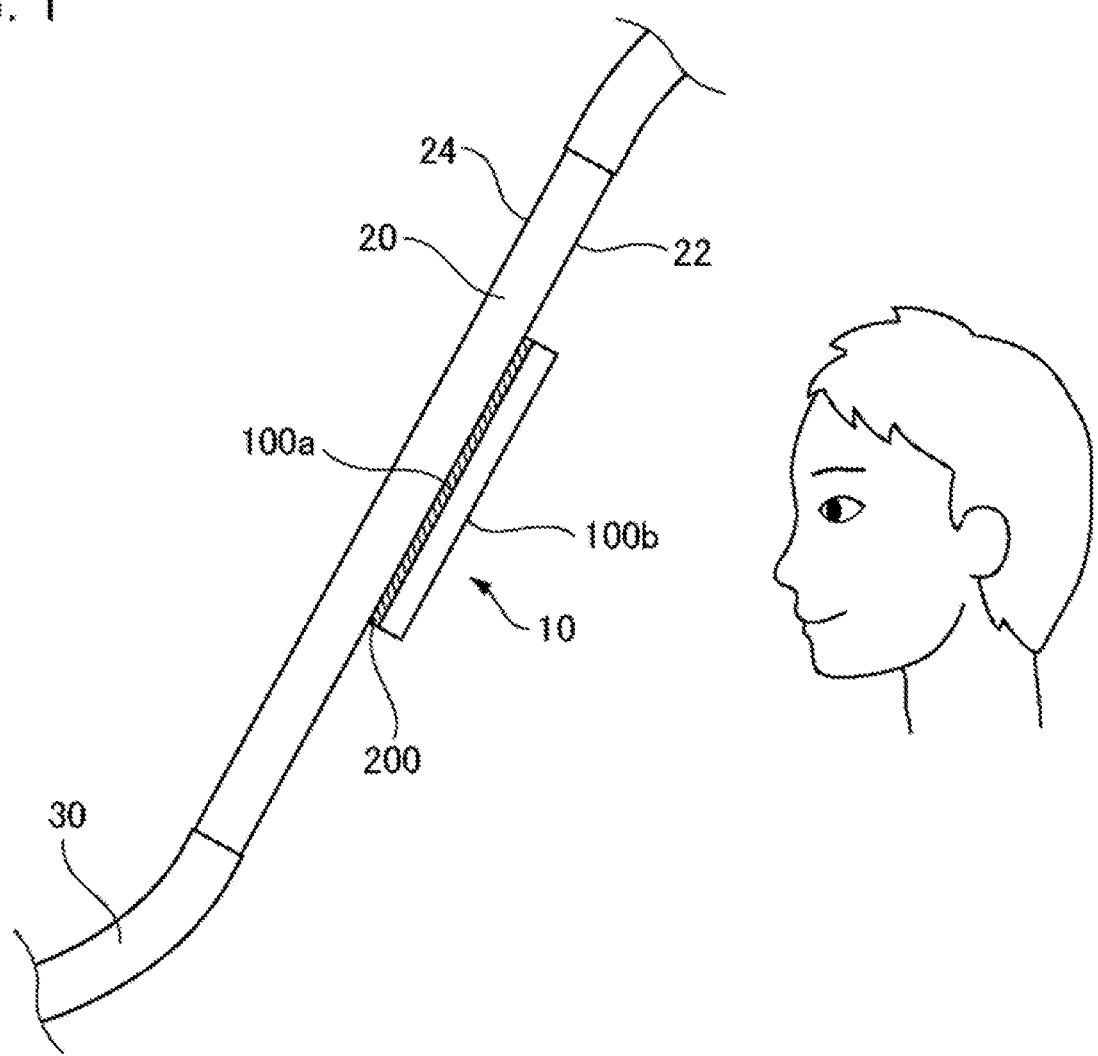
FIG. 1 is a cross-sectional view of a configuration of a light-emitting system according to an embodiment.

An embodiment of the present invention will be described below by referring to the drawings. Moreover, in all the drawings, the same constituent elements are given the same reference numerals, and descriptions thereof will not be repeated.

FIG. 1 is a cross-sectional view of a configuration of a light-emitting system. This light-emitting system includes a light-emitting device 10 and a partition member 20. The partition member 20 is light-transmitting, and partitions two spaces (a first space and a second space) from each other. One of the first space and the second space is, for example, an inner side of a structure or a mobile object. In other words, the partition member 20, for example, partitions a space occupied by a person from the outside. The light-emitting device 10 includes a substrate 100, a plurality of light-emitting units 140 (to be described later using FIG. 2) and an insulating film 150 (to be described later using FIG. 2). The light-emitting units 140 are disposed on a surface (a second surface 100b) of the substrate 100 on a side of the space occupied by a person, and includes, in order from the external side, a light-transmitting first electrode 110, an organic layer 120 (a light-emitting layer), and a second electrode 130. The insulating layer 150 defines the plurality of light-emitting units 140. Further, a third region 106 (a light-transmitting region) is provided in the substrate (199) between two light-emitting units 140 next to each other. The third region 106 is a region in which the insulating layer 150 and the second electrode 130 are not formed.

The partition member 20 is, for example, a window of a mobile object 30 for transporting a person, and is formed using glass or a light-transmitting resin. The mobile object 30 is, for example, an automobile, a train, or an airplane. In a case where the mobile object 30 is an automobile, the partition member 20 is a windshield, a rear windshield, or a side window (for example, a door window) installed at the side of the seat. In a case where the partition member 20 is a rear windshield, the plurality of light-emitting units 140 function as, for example, a brake light. In addition, in a case where the partition member 20 is a windshield or a rear windshield, the plurality of light-emitting units 140 may be a turn signal light. In addition, the partition member 20 may be a window for partitioning the interior and the exterior of a room such as a meeting room. The partition member may be a light-emitting system allowing to distinguish whether the meeting room is occupied, depending on the lighting/non-lighting of the light-emitting unit 140.

Further, a surface of the light-emitting device 10 on the light extraction side (for example, a first surface 100a of the substrate 100) is fixed to the inner surface (a first surface 22) of the partition member 20 through an adhesive layer 200. Therefore, light emitted from the light-emitting units 140 of the light-emitting device 10 is emitted to the outside of the mobile object 30 through the partition member 20. Further, as to be described later, the light-emitting device 10 has optical transparency. Therefore, a person inside the mobile object 30 can visually recognize the outside of the mobile object 30 through the partition member 20. Meanwhile, the first surface 100a of the substrate 100 may be entirely fixed to the first surface 22 of the partition member 20 via the adhesive layer 200, or a portion (for example, two sides facing each other) of the first surface 100a may be fixed to the first surface 22 of the partition member 20. Meanwhile, the light-emitting device 10 may be mounted on the partition member 20 in the light emitting direction of the light-emitting unit 140 to the interior of the mobile object 30 through the partition member 20.

Figure 2:
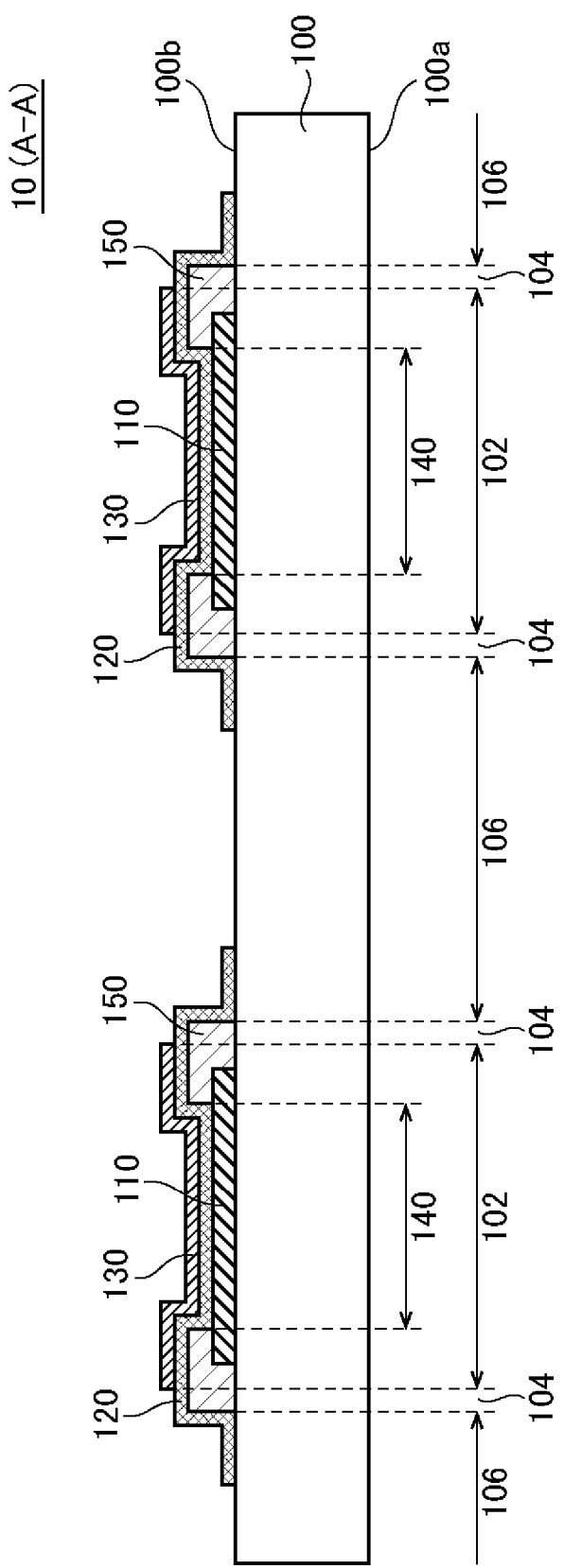
FIG. 2 is a cross-sectional view of a configuration of a light-emitting device according to the embodiment.
Figure 3:
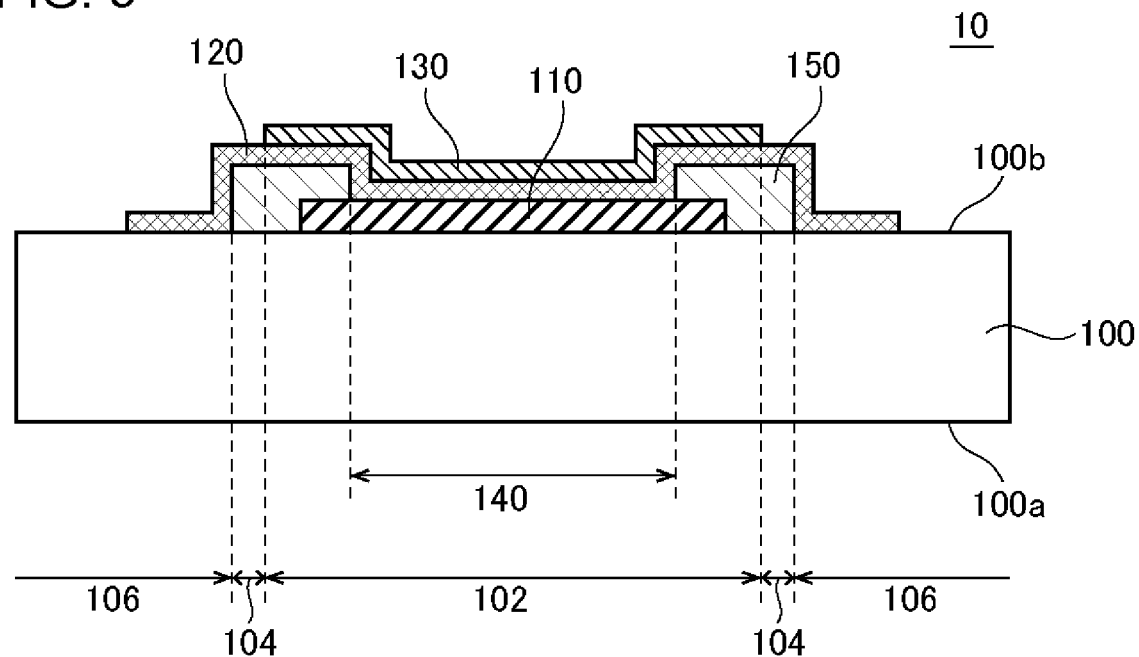
FIG. 3 is an enlarged view of a light-emitting unit of the light-emitting device.

FIG. 2 is a cross-sectional view of a configuration of the light-emitting device 10. FIG. 3 is an enlarged view illustrating the light-emitting unit 140 of the light-emitting device 10. The light-emitting device 10 according to the embodiment is an illumination device or a display device. FIG. 2 and FIG. 3 illustrate a case where the light-emitting device 10 is an illumination device. The light-emitting device 10 is provided with a substrate 100, a plurality of light-emitting units 140, and an insulating layer 150. A light-transmitting material is used for the substrate 100. The plurality of the light-emitting units 140 are separated from each other, each including a first electrode 110, an organic layer 120, and a second electrode 130. The first electrode 110 is a light-transmitting electrode, and the second electrode 130 has light shielding properties. The first electrode 110 and the second electrode 130 are at least partially overlapped. However, the second electrode 130 may also be a light-transmitting electrode. The organic layer 120 is positioned between the first electrode 110 and the second electrode 130. The insulating layer 150 covers an edge of the first electrode 110. Moreover, at least a portion of the insulating layer 150 is not covered by the second electrode 130.

Further, when viewed in a direction perpendicular to the substrate 100, the light-emitting device 10 includes a first region 102, a second region 104 and the third region 106 (a light-transmitting region). The first region 102 overlaps the second electrode 130. That is, when viewed in the direction perpendicular to the substrate 100, the first region 102 is a region which is covered by the second electrode 130. In a case where the second electrode 130 has light shielding properties, the first region 102 does not transmit light. The second region 104 is a region between the plurality of light-emitting units 140 which includes the insulating layer 150. The third region 106 is a region between the plurality of light-emitting units 140 which does not include the insulating layer 150. In addition, since the width of the second region 104 is narrower than that of the third region 106, the light-emitting device 10 has sufficient optical transparency. A detailed description will be provided below.

The substrate 100 is, for example, a glass substrate or a resin substrate which has optical transparency. The substrate 100 may have flexibility. In a case where the substrate has flexibility, the thickness of the substrate 100 is, for example, equal to or greater than 10 μm and equal to or less than 1,000 μm. The substrate 100 is polygonal, for example, rectangular, or round. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of $SiN_x$, SiON, or the like is preferably formed on at least one surface (preferably, both surfaces) of the substrate 100 in order to prevent moisture from permeating the substrate 100.

The light-emitting units 140 are formed on one surface of the substrate 100. Each light-emitting unit 140 has a configuration in which the first electrode 110, the organic layer 120 including a light-emitting layer, and the second electrode 130 are laminated in this order. In a case where the light-emitting device 10 is an illumination device, the plurality of light-emitting units 140 are linearly extended. On the other hand, in a case where the light-emitting device 10 is a display device, the plurality of light-emitting units 140 may be disposed to constitute a matrix or a segment, or disposed to display a predetermined shape (for example, an icon). Further, the plurality of light-emitting units 140 are formed in accordance with each pixel.

The first electrode 110 is a transparent electrode having optical transparency. A material of the transparent electrode is a material containing a metal, for example, a metal oxide formed of an indium tin oxide (ITO), an indium zinc oxide (IZO), an indium tungsten zinc oxide (IWZO), a zinc oxide (ZnO), or the like. The thickness of the first electrode 110 is, for example, equal to or greater than 10 nm and equal to or less than 500 nm. The first electrode 110 is formed by, for example, sputtering or vapor deposition. Meanwhile, the first electrode 110 may be a conductive organic material such as carbon nanotubes or PEDOT/PSS. In addition, the first electrode 110 may include a laminated structure in which a plurality of films are laminated. In the diagram, a plurality of the first electrodes 110 are linearly formed in parallel to each other on the substrate 100. Therefore, the first electrode 110 is not located in the second region 104 or in the third region 106.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed by vapor deposition. In addition, at least one layer of the organic layer 120, for example, a layer which is in contact with the first electrode 110, may be formed using a coating method such as ink jetting, printing, or spraying. Meanwhile, in this case, the remaining layers of the organic layer 120 are formed by vapor deposition. In addition, all layers of the organic layer 120 may be formed using a coating method. Additionally, another light emitting layer (for example, an inorganic light emitting layer) may be provided instead of the organic layer 120.

The second electrode 130 includes a metal layer composed of a metal selected from a first group consisting of, for example, Al, Au, Ag, Pt, Mg, Sn, Zn, and In, or an alloy of metals selected from the first group. In this case, the second electrode 130 has light shielding properties. The thickness of the second electrode 130 is, for example, equal to or greater than 10 nm and equal to or less than 500 nm. However, the second electrode 130 may be formed using a material exemplified as the material of the first electrode 110. The second electrode 130 is formed by, for example, sputtering or vapor deposition. In the example shown in the drawing, the light-emitting device 10 includes a plurality of linear second electrodes 130. Each second electrode 130 is provided for each first electrode 110, and the width of each second electrode 130 is wider than that of each first electrode 110. Therefore, when viewed from a direction perpendicular to the substrate 100, the entire first electrode 110 is overlapped and covered by the second electrode 130 in the width direction. In addition, the width of the first electrode 110 is wider than that of the second electrode 130, and when viewed from a direction perpendicular to the substrate 100, the second electrode 130 is entirely overlapped and covered by the first electrode 110 in the width direction.

The edge of the first electrode 110 is covered by the insulating layer 150. The insulating layer 150 is formed of a photosensitive resin material such as, for example, polyimide, and surrounds a portion of the first electrode 110, the portion serving as the light-emitting unit 140. An edge of the second electrode 130 in the width direction is located over the insulating film 150. In other words, when viewed from a direction perpendicular to the substrate 100, a portion of the insulating layer 150 protrudes from the second electrode 130. In addition, in the example illustrated in the diagram, the organic layer 120 is formed on top and side of the insulating layer 150. However, the organic layer 120 is separated in a region between the light-emitting units 140 next to each other.

In addition, as described above, the light-emitting device 10 includes the first region 102, the second region 104, and the third region 106. The first region 102 is a region which overlaps with the second electrode 130. The second region 104 is a region which includes the insulating layer 150 in the region between the plurality of light-emitting units 140. In the example shown in the drawing, the second region 104 is a region which overlaps with the insulating layer 150 and does not overlap with the second electrode 130. Further, the organic layer 120 is also formed in the second region 104. The third region 106 is a region between the plurality of light-emitting units 140 which does not include the insulating layer 150. In the example shown in the drawing, at least a portion of the third region 106 is not formed with the organic layer 120. In addition, the width of the second region 104 is narrower than that of the third region 106. Moreover, the width of the third region 106 may be wider or narrower than that of the first region 102. In a case where the width of the first region 102 is 1, the width of the second region 104 is, for example, equal to or greater than 0 (or more than 0 or equal to or greater than 0.1) and equal to or less than 0.2, and the width of the third region 106 is, for example, equal to or greater than 0.3 and equal to or less than 2. In addition, the width of the first region 102 is, for example, equal to or greater than 50 μm and equal to or less than 500 and the width of the second region 104 is, for example, equal to or greater than 0 μm (or more than 0 μm) and equal to or less than 100 and the width of the third region 106 is, for example, equal to or greater than 15 μm and equal to or less than 1,000 μm.

Figure 4:
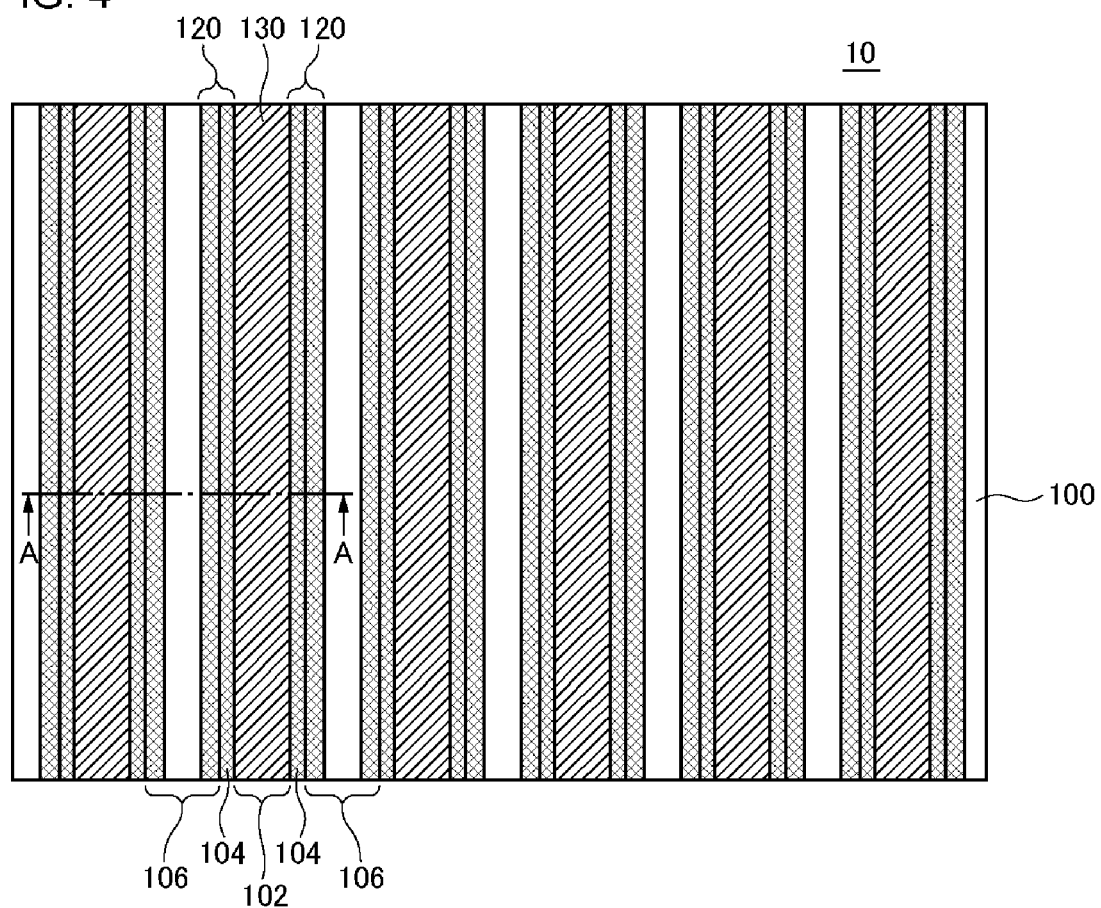
FIG. 4 is a plan view of the light-emitting device.

FIG. 4 is a plan view of the light-emitting device 10. Meanwhile, FIG. 2 corresponds to a cross-sectional view taken along line A-A of FIG. 4. In the example shown in FIG. 4, each of the first region 102, the second region 104, and the third region 106 extend linearly in the same direction. In addition, as illustrated in FIG. 4 and FIG. 2, the second region 104, the first region 102, the second region 104, and the third region 106 are repeatedly aligned in this order.

Next, a method of manufacturing the light-emitting device 10 will be described. First, the first electrode 110 is formed on the substrate 100 by, for example, sputtering. Then, the first electrode 110 is formed in a predetermined pattern by, for example, photolithography. The insulating layer 150 is then formed over an edge of the first electrode 110. For example, in a case where the insulating layer 150 is formed of a photosensitive resin, the insulating layer 150 is formed in a predetermined pattern by undergoing exposure and development steps. Next, the organic layer 120 and the second electrode 130 are formed in this order. In a case where the organic layer 120 includes a layer formed by vapor deposition, this layer is formed in a predetermined pattern using a mask or the like. The second electrode 130 is also formed in a predetermined pattern using, for example, a mask. Thereafter, the light-emitting unit 140 is sealed using a sealing member (not shown in the drawing).

The adhesive layer 200 is for bonding the light-emitting device 10 to the partition member 20. As long as a material fulfilling such a function is used for the adhesive layer, there is no particular limitation to the material thereof. In addition, in a case where the refractive index of the partition member 20 and the refractive index of the substrate 100 of the light-emitting device 10 are the same, for example, when both are formed of glass, the adhesive layer 200 having a refractive index the same as or close to that of the both is used. In a case where the partition member 20 and the substrate 100 are different from each other in refractive indexes (for example, when the partition member 20 is formed of plastic, and the substrate 100 is formed of glass), the refractive index of the adhesive layer 200 is preferably a numerical value between the refractive index of the partition member 20 and the refractive index of the substrate 100. Such a configuration is adopted so that light emitted from the light-emitting device 10 may be efficiently extracted to the outside through the partition member 20. In addition, the light-emitting device 10 and the partition member 20 are preferably bonded to each other without any gaps therebetween. This is because, in a case where there is a gap therebetween, light emitted from the light-emitting device 10 is reflected on the partition member 20, and the reflected light is transmitted to the inside via the second region 104 and the third region 106 of the light-emitting device 10.

In the present invention, among the first region 102, the second region 104, and the third region 106, the third region 106 has the highest light transmittance (a transmissive portion), and the first region 102 includes the light-emitting unit 140 and has the lowest light transmittance. Further, the light transmittance of the second region 104 is lower than that of the third region 106 due to the second region 104 (a semi-transmissive portion) including the insulating layer 150. However, the light transmittance of the second region 104 is higher than that of the first region 102. In addition, an intensity of light emitted from the light-emitting device 10 to the above-mentioned second space (for example, a space occupied by a person, and in the diagram, a region on the second region 100b side) is equal to or greater than 0% and equal to or less than 10%, or preferably equal to or greater than 0% and equal to or less than 1%, or more preferably equal to or greater than 0% and equal to or less than 0.1% of the intensity of light emitted from the light-emitting device 10 to the above-mentioned first space (for example, a region on the external side, and in the diagram, a region on the first surface 100a side). This is because, in the first region 102 including the light-emitting unit 140, the second electrode 130 having light shielding properties is located on the side of the organic layer 120 of the space occupied by a person.

In addition, in the present embodiment, the width of the second region 104 is narrower than that of the third region 106. Thus, in the light-emitting device 10, an area occupying ratio of the second region 104 is lower than that of the third region 106. Therefore, the light transmittance of the light-emitting device 10 is increased. Thus, even when the light-emitting device 10 is mounted on the partition member 20, the person inside the mobile object 30 can visually recognize the outside of the mobile object 30 through the light-emitting device 10 and the partition member 20. Further, in a case where the second electrode 130 is formed of a material such as a metal having light shielding properties, the light from the light-emitting unit 140 does not easily reach the person inside the mobile object 30. Thus, visibility from the inside to the outside of the mobile object 30 is prevented from decreasing due to light from the light-emitting unit 140.

Further, the insulating layer 150 is formed of a light-transmitting material. The light transmittance of the light-transmitting material differs depending on a wavelength of light. Thus, in a case where the width of the insulating layer 150 is wide, when light is transmitted through the insulating layer 150, a spectral distribution of the light changes. In this case, when an object is viewed through the light-emitting device 10, the color of the object may look different from the actual color. That is, the color of the object may change through the light-emitting device 10. For example, in a case where absorption of the wavelength of a blue color from 400 nm to 600 nm is 50% and is higher than the absorption of the wavelength of other colors, when the object is viewed through the light-emitting device 10, the blue color is reduced and the object would look yellowish. In contrast, in the present embodiment, since the width of the second region 104 is narrower than the width of the third region 106, it is possible to inhibit the above-mentioned change in color.

EXAMPLE

Example 1

Figure 5:
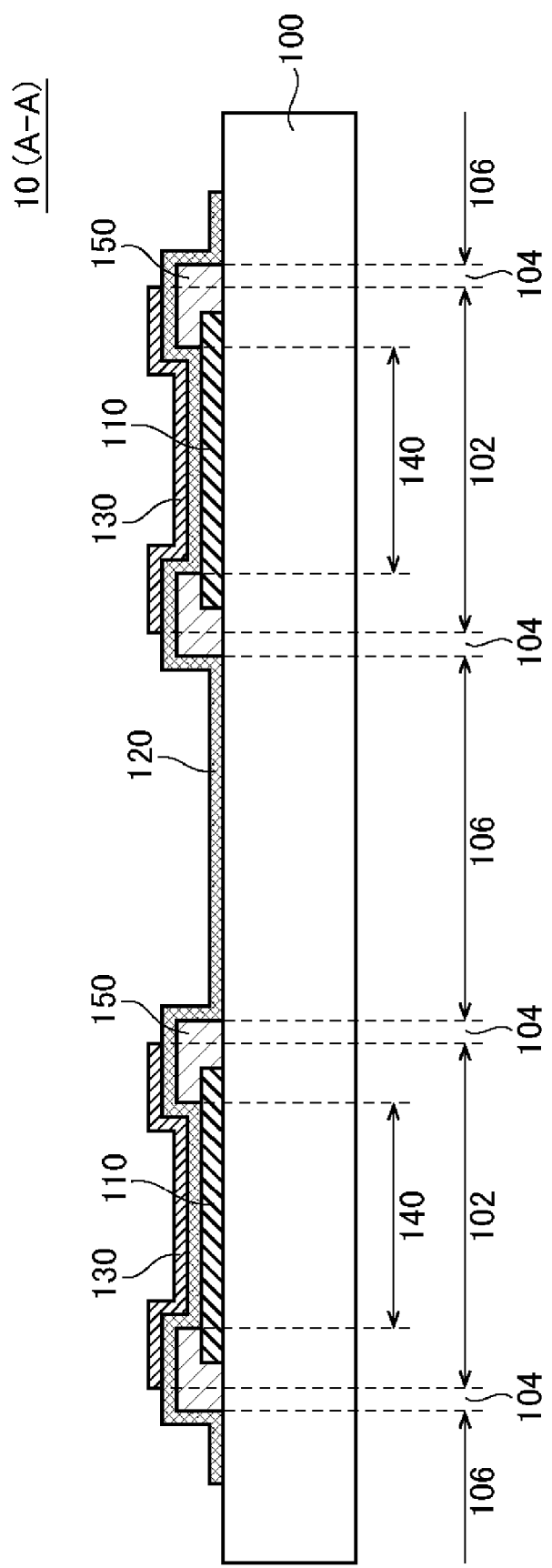
FIG. 5 is a cross-sectional view of a configuration of a light-emitting device according to Example 1.

FIG. 5 is a cross-sectional view of a configuration of a light-emitting device 10 according to Example 1, and corresponds to FIG. 2 of the embodiment. The light-emitting device 10 according to the present example has the same configuration as that of the light-emitting device 10 according to the embodiment, except for the layout of the organic layer 120. Further, an exemplary use of the light-emitting device 10 according to the present example is as described in the embodiment.

In the present embodiment, the organic layer 120 is formed on the entire surface of the third region 106. In other words, the organic layer 120 is continuously formed in the first region 102, the second region 104, and the third region 106. Also, the organic layer 120 is continuously formed to connect the plurality of light-emitting units 140.

FIG. 18 show measured results of angular dependence of emission intensity with respect to the first surface 100a side (FIG. 18(a)) and the emission intensity with respect to the second surface 100b side (FIG. 18(b)) in the light-emitting device 10 according to the present example. In the measurements, the direction of a perpendicular line of the substrate 100 was set to 0 degrees, and the direction parallel to the substrate 100 was set to 90 degrees.

As illustrated in FIG. 18(a), on the first surface 100a side of the light-emitting device 10, an angle at which the emission intensity was the strongest was 0 degrees. Then, as the angle increased (in other words, as the measuring direction is moved diagonally from the front side of the light-emitting device 10), the emission intensity decreased.

Moreover, as illustrated in FIG. 18(b), on the second surface 100b side of the light-emitting device 10, the angle at which the emission intensity was the weakest was 0 degrees. However, at any angle, the emission intensity of the light-emitting device 10 with respect to the second surface 100b side of the light-emitting device 10 was equal to or less than 5% of the emission intensity with respect to the first surface 100a side of the light-emitting device 10. In particular, at the front side (0 degrees) of the light-emitting device 10, the emission intensity of the light-emitting device 10 with respect to the second surface 100b side of the light-emitting device 10 was equal to or less than 0.02% of the emission intensity with respect to the first surface 100a side.

FIG. 19 show measured results of the angular dependence of emission spectra measured on each of the first surface 100a side (FIG. 19(a)) and the second surface 100b side (FIG. 19(b)). Meanwhile, a light-emitting layer of the organic layer 120 includes a red light-emitting material.

Also in the present example, the same as the embodiment, light transmittance of the light-emitting device 10 is increased. In addition, since the organic layer 120 is continuously formed, the cost for manufacturing the organic layer 120 is reduced.

Example 2

Figure 6:
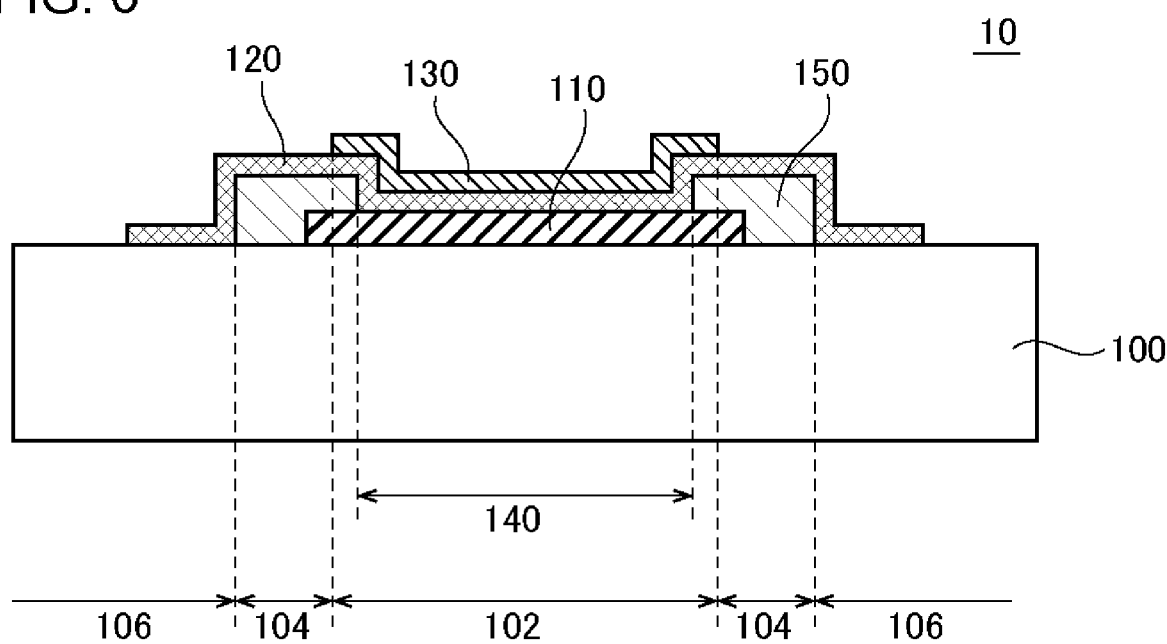
FIG. 6 is a cross-sectional view of a configuration of a light-emitting device according to Example 2.

FIG. 6 is a cross-sectional view of a configuration of a light-emitting device 10 according to Example 2, and corresponds to FIG. 3 of the embodiment. The light-emitting device 10 according to the present example has the same configuration as that of the light-emitting device 10 according to Embodiment 1, except for the width of the second electrode 130. Further, an exemplary use of the light-emitting device 10 according to the present example is as described in the embodiment.

In the present example, a width of the second electrode 130 is narrower than that of the first electrode 110. Therefore, when viewed from a direction perpendicular to the substrate 100, an end portion of the first electrode 110 protrudes from the second electrode 130. In other words, a portion of the second region 104 is overlapped with the first electrode 110.

Also in the present example, the same as the embodiment, light transmittance of the light-emitting device 10 is increased.

Example 3

Figure 7:
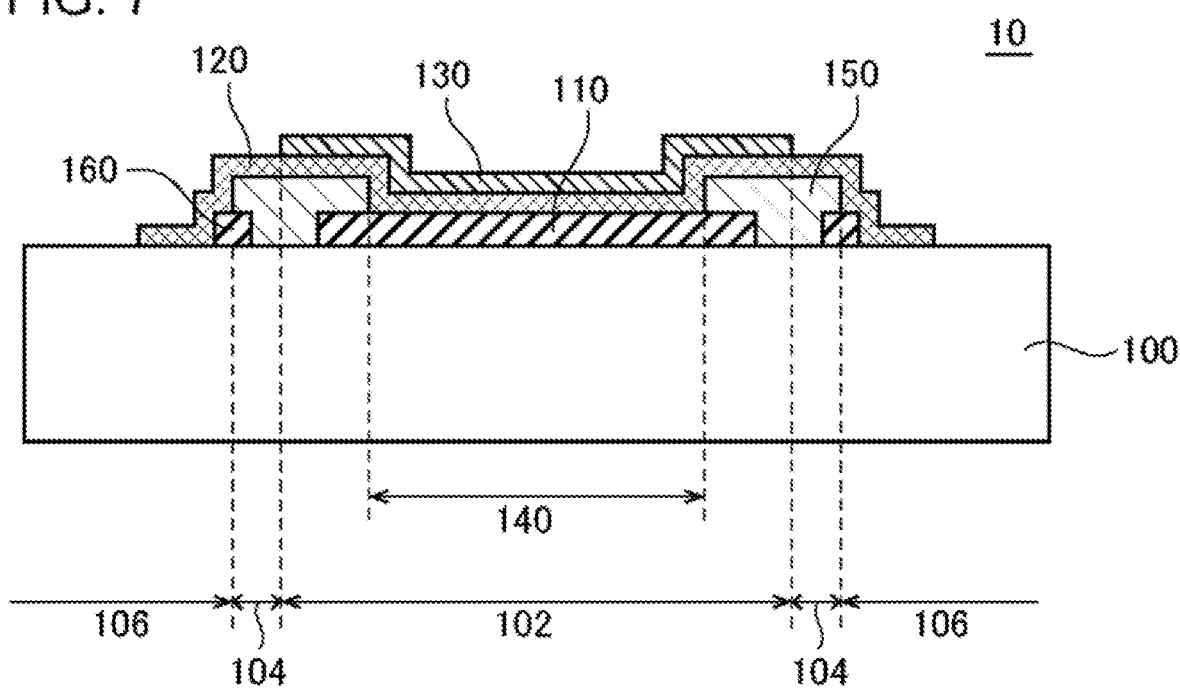
FIG. 7 is a cross-sectional view of a configuration of a light-emitting device according to Example 3.

FIG. 7 is a cross-sectional view of a configuration of a light-emitting device 10 according to Example 3, and corresponds to FIG. 3 of the embodiment. The light-emitting device 10 according to the present example has the same configuration as that of the light-emitting device 10 according to Embodiment 1, except that a peeling prevention portion 160 is included. Further, an exemplary use of the light-emitting device 10 according to the present example is as described in the embodiment.

The peeling prevention portion 160 is provided on a surface of the substrate 100 where the light-emitting unit 140 is formed. The peeling prevention portion 160 is insulated from the first electrode 110 and is formed of a material having higher adhesiveness to the insulating layer 150 than the substrate 100. The insulating layer 150 is continuously formed from an edge of the first electrode 110 to the peeling prevention portion 160. In the example shown in the drawing, the peeling prevention portion 160 is formed of the same material as the first electrode 110, and by being physically separated from the first electrode 110, the peeling prevention portion 160 is insulated from the first electrode 110. In this case, the peeling prevention portion 160 is formed in the same step as that of the first electrode 110. In addition, the insulating layer 150 is also formed over a region in the substrate 100 which is located between the peeling prevention portion 160 and the first electrode 110. In addition, an edge of the insulating layer 150 is located on the peeling prevention portion 160.

Also in the present example, the same as the embodiment, light transmittance of the light-emitting device 10 is increased. In addition, the edge of the insulating layer 150 is located on the peeling prevention portion 160. The peeling prevention portion 160 has higher adhesiveness to the insulating layer 150 compared to that of the substrate 100. Therefore, it is possible to inhibit the insulating layer 150 from peeling off. Peeling of the insulating layer 150 is further prevented in a case of using a substrate 100 having flexibility.

Example 4

Figure 8:
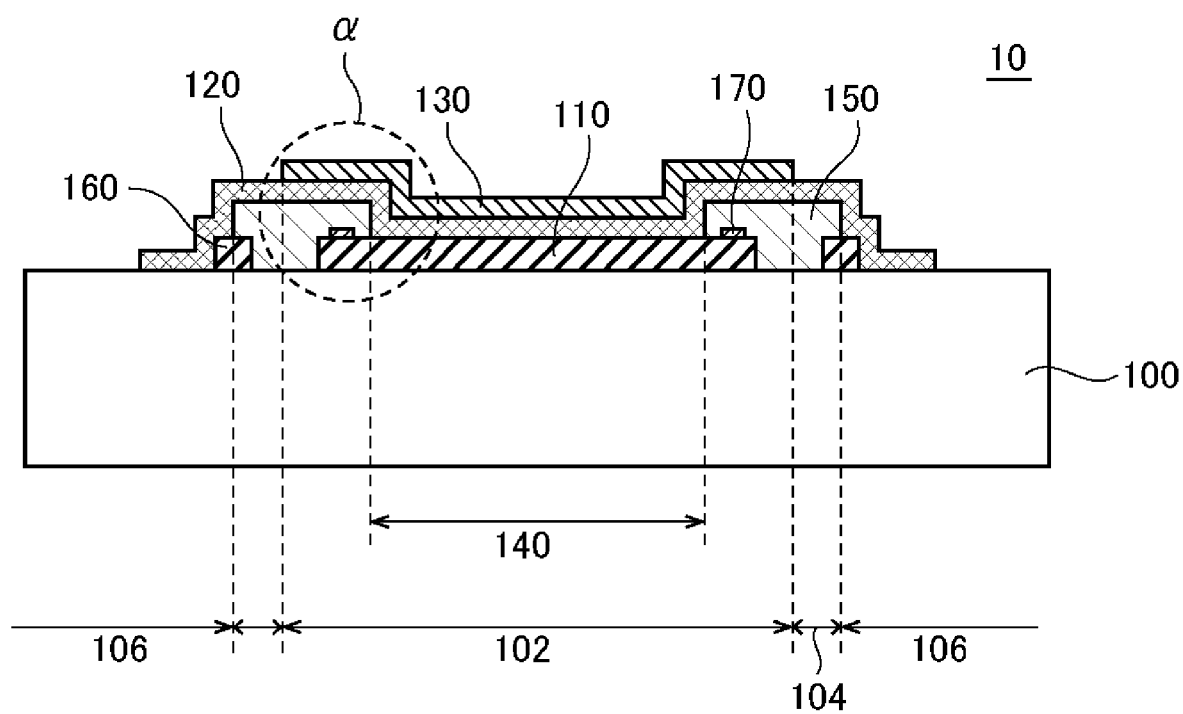
FIG. 8 is a cross-sectional view of a configuration of a light-emitting device according to Example 4.

FIG. 8 is a cross-sectional view of a configuration of a light-emitting device 10 according to Example 4, and corresponds to FIG. 3 of the embodiment. The light-emitting device 10 according to the present example has the same configuration as that of the light-emitting device 10 according to Example 3, except that a conductive portion 170 is included. Further, an exemplary use of the light-emitting device 10 according to the present example is as described in the embodiment.

The conductive portion 170 is, for example, an auxiliary electrode of the first electrode 110, and in contact with the first electrode 110. The conductive portion 170 is formed of a material having a lower resistance value than that of the first electrode 110, and is formed using, for example, at least one metal layer. The conductive portion 170 has, for example, a configuration in which a first metal layer of Mo, a Mo alloy, or the like, a second metal layer of Al, an Al alloy, or the like, and a third metal layer of Mo, a Mo alloy, or the like are laminated in this order. The second metal layer out of these three metal layers is the thickest. The conductive portion 170 is covered by the insulating layer 150. For this reason, the conductive portion 170 is not directly connected to any of the organic layer 120 and the second electrode 130.

FIG. 9(a) is a first example of an enlarged view of a region illustrated in FIG. 8 surrounded by a dotted line a. In the example shown in FIG. 9(a), the conductive portion 170 includes a configuration where a second layer 174 is laminated on a first layer 172. The first layer 172 is formed of a metal, for example, Al, an Al alloy, or the like, and the second layer 174 is formed of a conductive material which is harder than the first layer 172 and has a lower etching rate than the first layer 172, for example, Mo or an Mo alloy. Further, the first layer 172 is formed of a material having lower resistance than the second layer 174. In a case where the first layer 172 is formed of an AlNd alloy, the second layer 174 is formed of a MoNb alloy. The thickness of the first layer 172 is, for example, equal to or greater than 50 nm and equal to or less than 1,000 nm and is preferably equal to or less than 600 nm. The second layer 174 is thinner than the first layer 172. The thickness of the second layer 174 is, for example, equal to or less than 100 nm, preferably equal to or less than 60 nm, and more preferably equal to or less than 30 nm.

Further, the reflectance of visible light of the second layer 174 is lower than that of the first layer 172. For example, the reflectance of visible light of the second layer 174 at a wavelength of 530 nm is approximately 60% and that of the first layer 172 is approximately 90%.

In addition, the width of the first layer 172 is narrower than that of the second layer 174. Thus, in the width direction of the conductive portion 170, an end portion of the first layer 172 is located at a more central side of the conductive portion 170 than the end portion of the second layer 174. An interval d between the edge portion of the first layer 172 and the edge portion of the second layer 174 is preferably equal to or more than 150 nm, and more preferably equal to or more than 300 nm.

In addition, at least a portion of the conductive portion 170 overlaps the second electrode 130. A width w of the portion of the conductive portion 170 which overlaps the second electrode 130 is preferably, for example, more than 150 nm. In the example shown in the drawing, the entire portion of the conductive portion 170 overlaps the second electrode 130.

The timing for forming the conductive portion 170 is after forming the first electrode 110, and before forming the insulating layer 150. The conductive portion 170 is formed, for example, as follows. First, the first layer 172 and the second layer 174 are formed in this order by a film formation method such as, for example, sputtering. Next, a resist pattern (not shown) is formed on the second layer 174, and using this resist pattern as a mask, the second layer 174 and the first layer 172 are etched (for example, wet-etched). At this time, the etching is isotropic etching. Further, the etching is conducted under the condition that the etching rate of the first layer 172 is faster than the etching rate of the second layer 174. Thus, the first layer 172 is etched faster than the second layer 174. As a result, a side of the first layer 172 is eaten into the central side of the conductive portion 170 than a side of the second layer 174. That is, the end portion of the first layer 172 is located in a more central side of the conductive portion 170 than the end portion of the second layer 174. Meanwhile, the distance of the interval d is controlled by adjusting the etching condition (for example, the etching time).

Also in the present example, the same as the embodiment, light transmittance of the light-emitting device 10 is increased. Further, the conductive portion 170 is formed on the first electrode 110, thereby lowering the apparent resistance value of the first electrode 110. Also, the color of an object viewed through the light-emitting device 10 is inhibited from appearing different from the actual color.

Further, since the conductive portion 170 is covered by the insulating layer 150, when light is reflected on an end face of the conductive portion 170, the amount of light which passes through the insulating layer 150 is increased. Since the light transmittance of the insulating layer 150 differs depending on the wavelength of light, when the amount of the light which passes through the insulating layer 150 is increased, an object viewed through the light-emitting device 10 may highly possibly appear changed in color. In contrast, in the present embodiment, the reflectance of visible light of the second layer 174 is lower than that of the first layer 172. In addition, the end portion of the first layer 172 is located in a more central side of the conductive portion 170 than the end portion of the second layer 174. Therefore, at least a portion of the light which is incident on the end portion of the first layer 172 is shielded by the second layer 174. Thereby, it is possible to reduce the amount of light passing through the insulating layer 150.

Meanwhile, as illustrated in FIG. 9(b), the conductive portion 170 may include a configuration where the first layer 172 is laminated on the second layer 174. In this case, at least a portion of the light which is reflected on the end portion of the first layer 172 is shielded by the second layer 174 before being incident on the substrate 100. Thereby, it is possible to reduce the amount of light passing through the insulating layer 150.

Further, as illustrated in FIG. 9(c), the conductive portion 170 may include the structure where the second layer 174, the first layer 172 and the second layer 174 are laminated in this order. In an example in FIG. 9(c), a film thickness of the two second layers 174 may be different from each other, or may be the same as each other.

Example 5

Figure 10:
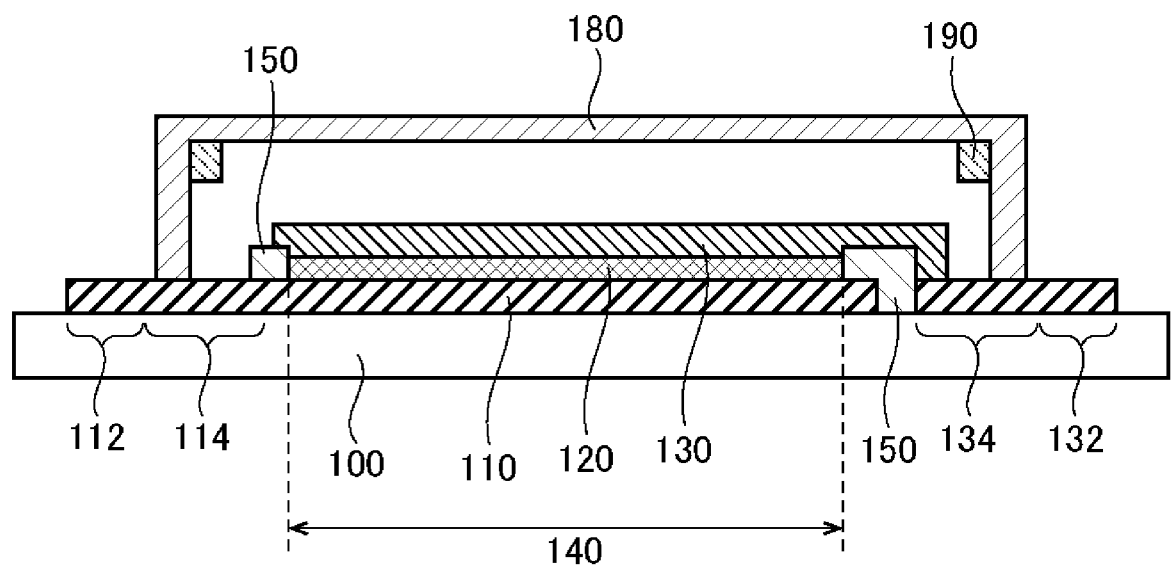
FIG. 10 is a cross-sectional view of a configuration of a light-emitting device according to Example 5.
Figure 11:
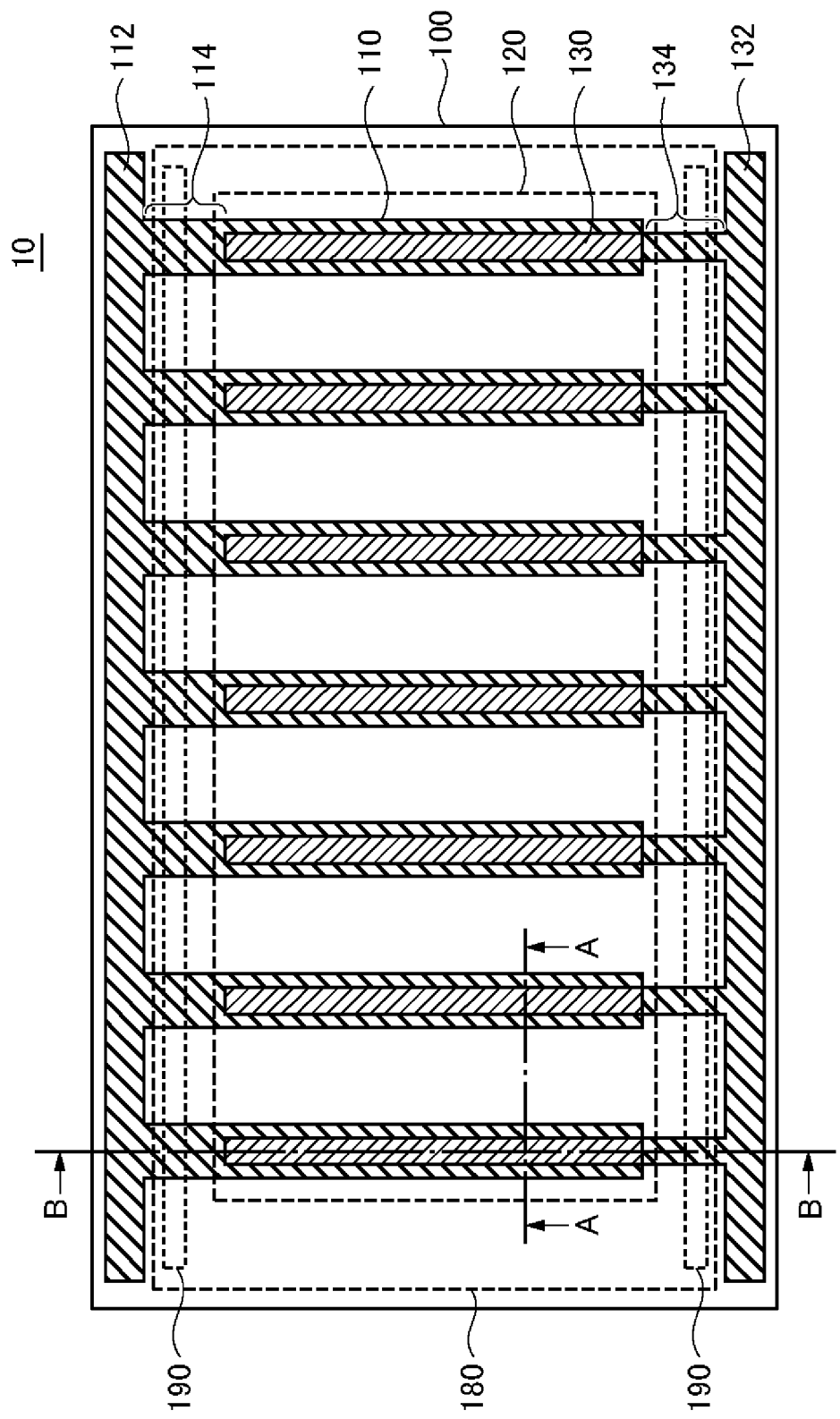
FIG. 11 is a plan view of the light-emitting device illustrated in FIG. 9.

FIG. 10 is a cross-sectional view of a configuration of a light-emitting device 10 according to Example 5. FIG. 11 is a plan view of the light-emitting device 10 illustrated in FIG. 10. However, in FIG. 11, some members are omitted. FIG. 10 corresponds to a cross-sectional view taken along line B-B of FIG. 11. The light-emitting device 10 according to the present example has the same configuration as that of the light-emitting device 10 according to the embodiment or any of Examples 1 to 4, except that a sealing member 180 and a desiccant 190 are included.

In the present example shown in the drawing, the planar shape of the substrate 100 is polygonal such as, for example, rectangular, or the like, or round. The sealing member 180 is light-transmitting and is formed using, for example, glass or a resin. Similarly to the substrate 100, the sealing member 180 has a polygonal or a round shape, and has a concave portion at the center. In addition, an edge of the sealing member 180 is fixed to the substrate 100 with an adhesive. Thereby, a space surrounded by the sealing member 180 and the substrate 100 is sealed. In addition, each of the plurality of light-emitting units 140 is located inside the sealed space.

Further, the light-emitting device 10 includes a first terminal 112, a first lead-out wiring 114, a second terminal 132, and a second lead-out wiring 134. Each of the first terminal 112, the first lead-out wiring 114, the second terminal 132, and the second lead-out wiring 134 are formed on the same surface as the surface of the substrate 100 on which the light-emitting unit 140 is formed. The first terminal 112 and the second terminal 132 are located outside the sealing member 180. The first lead-out wiring 114 connects the first terminal 112 to the first electrode 110, and the second lead-out wiring 134 connects the second terminal 132 to the second electrode 130. In other words, both of the first lead-out wiring 114 and the second lead-out wiring 134 extend from the inside to the outside of the sealing member 180.

The first terminal 112, the second terminal 132, the first lead-out wiring 114 and the second lead-out wiring 134 have, for example, a layer formed of the same material as that of the first electrode 110. Further, at least a portion of at least one of the first terminal 112, the second terminal 132, the first lead-out wiring 114 and the second lead-out wiring 134 may include thereon, a metal film having lower resistance than the first electrode 110 (for example, the same film as the conductive portion 170). It is not necessary that the metal film is formed on each of the first terminal 112, the second terminal 132, the first lead-out wiring 114 and the second lead-out wiring 134. A layer formed of the same material as the first electrode 110 in the first terminal 112, the first lead-out wiring 114, the second terminal 132, and the second lead-out wiring 134 is formed in the same step as that of forming the first electrode 110. Therefore, the first electrode 110 is formed integrally with at least a part of the layer of the first terminal 112. In addition, when these include the metal film, this metal film is formed in, for example, the same step as that of forming the conductive portion 170. In this case, the light transmittance of the first terminal 112, the first lead-out wiring 114, the second terminal 132, and the second lead-out wiring 134 is lower than the light transmittance of the substrate 100.

In the example shown in the drawing, one first lead-out wiring 114 and one second lead-out wiring 134 are formed for each light-emitting unit 140. Each of the plurality of first lead-out wirings 114 is connected to the same first terminal 112, and each of the plurality of second lead-out wirings 134 is connected to the same second terminal 132. A positive electrode terminal of a control circuit is connected to the first terminal 112 via a conductive member such as a bonding wire, a lead terminal, or the like, and a negative electrode terminal of the control circuit is connected to the second terminal 132 via a conductive member such as a bonding wire, a lead terminal, or the like.

In addition, the desiccant 190 is disposed in a region in the space sealed by the sealing member 180 which does not overlap any of the light-emitting units 140 when viewed from a direction perpendicular to the substrate 100, for example, a region which overlaps at least one of the first lead-out wiring 114 and the second lead-out wiring 134.

Specifically, the desiccant 190 contains a desiccant member such as, for example, CaO, BaO, or the like. The light transmittance of the desiccant 190 is lower than that of the substrate 100. The desiccant 190 is fixed to a surface of the sealing member 180 facing the substrate 100. In the example shown in the drawing, the desiccant 190 is disposed in each of a region which overlaps the first lead-out wiring 114 and a region which overlaps the second lead-out wiring 134. In other words, the desiccant 190 is disposed along two sides of the rectangular substrate 100 facing each other, however, is not disposed along the remaining two sides, that is, the desiccant 190 is not disposed at locations along the remaining two sides and at the light-emitting units 140.

Figure 12:
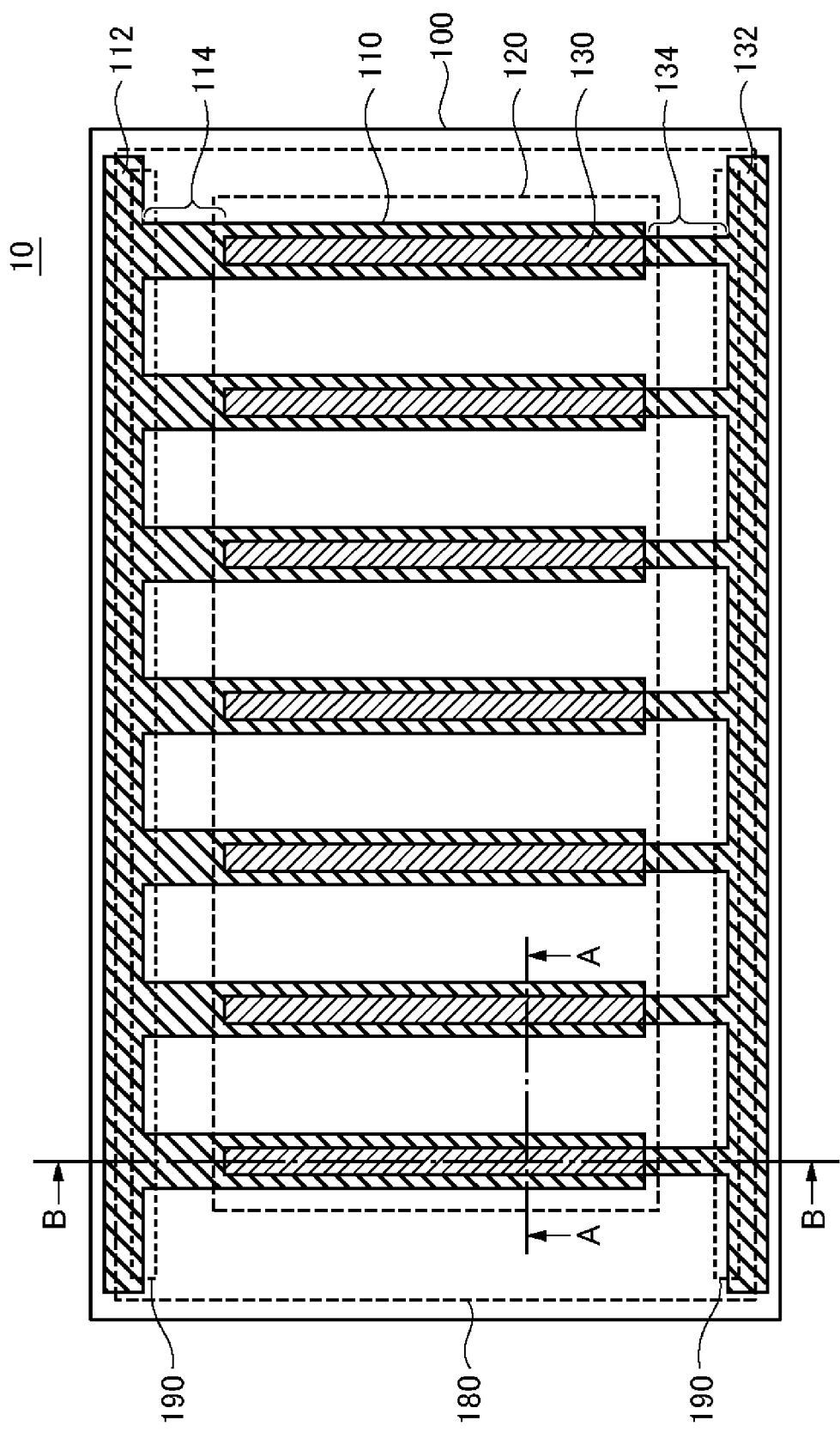
FIG. 12 is a plan view of a modification example of the light-emitting device illustrated in FIG. 11.

FIG. 12 is a plan view of a modification example of the light-emitting device illustrated in FIG. 11. In the example shown in the drawing, a portion of the first terminal 112 and a portion of the second terminal 132 are located on the inner side of the sealing member 180. In addition, at least a portion of the desiccant 190 overlaps at least one of the first terminal 112 and the second terminal 132.

Also in the present example, the same as the embodiment, light transmittance of the light-emitting device 10 is increased. In addition, when viewed from the direction perpendicular to the substrate 100, the desiccant 190 does not overlap the light-emitting units 140, but is located near an edge of the substrate 100. Therefore, compared to a case where the desiccant 190 is provided in a location which overlaps the light-emitting units 140, the desiccant 190 is better prevented from being visually recognized by a user. In the present embodiment, in particular, the desiccant 190 overlaps the first lead-out wiring 114 and the second lead-out wiring 134. Both the first lead-out wiring 114 and the second lead-out wiring 134 have low light transmittance. Therefore, compared to a case where the desiccant 190 is not overlapped with the first lead-out wiring 114 and the second lead-out wiring 134, the light transmittance of the light-emitting device 10 is improved. In particular, in a case where the first terminal 112 and the second terminal 132 are overlapped with the desiccant 190, the light transmittance of the light-emitting device 10 is remarkably improved, compared to the case in which the desiccant 190 is overlapped with the terminals.

The brightness of the light-emitting unit 140 differ depending on the temperature of the organic layer 120. In a case where the desiccant 190 is provided in a location which overlaps the organic layer 120, at least a part of heat emitted from the light-emitting units 140 is absorbed by the desiccant 190. The temperature of a region of the organic layer 120 which overlaps the desiccant 190 thus becomes lower than that of another region of the organic layer 120. In this case, an in-plane variation occurs in the brightness of the light-emitting unit 140.

In contrast, in this example, the desiccant 190 does not overlap the light-emitting unit 140. Therefore, it is possible to inhibit the occurrence of in-plane variation in the brightness of the light-emitting unit 140.

In addition, the brightness of a region of the light emitting unit 140 located near the first lead-out wiring 114 and the brightness of a region of the light-emitting unit 140 located near the second lead-out wiring 134 is increased compared to the brightness of the central part of the light-emitting unit 140 due to the resistance of the first electrode 110 and the second electrode 130. On the other hand, in the present example, the desiccant 190 is provided in a location which overlaps the first lead-out wiring 114 and in a location which overlaps the second lead-out wiring 134. Thereby, both of the temperature of a region of the organic layer 120 located near the first lead-out wiring 114 and the temperature of a region of the organic layer 120 located near the second lead-out wiring 134 become lower than the temperature of a region of the organic layer 120 located in the central part of the light-emitting unit 140. Thus, variation in brightness of the light-emitting unit 140 resulting from the resistance of the first electrode 110 and the second electrode 130 is absorbed. Therefore, in-plane variation in brightness of the light-emitting unit 140 is reduced.

Example 6

Figure 13:
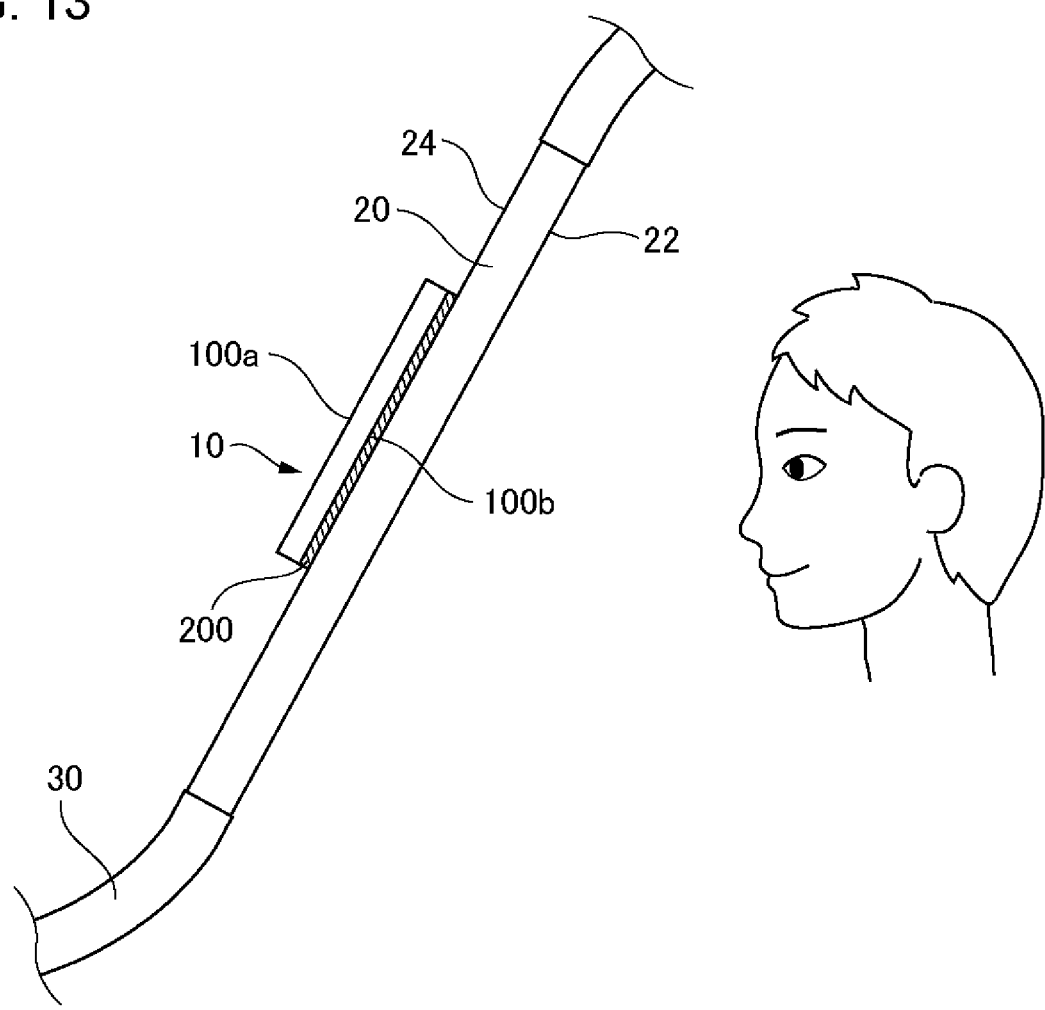
FIG. 13 is a cross-sectional view of a configuration of a light-emitting system according to Example 6.

FIG. 13 is a cross-sectional view of a configuration of a light-emitting system according to Example 6, and corresponds to FIG. 1 of the embodiment. The light-emitting system according to the present example has the same configuration as that of the light-emitting system according to the embodiment, except that the light-emitting device 10 is mounted on the outside surface (a second surface 24) of the partition member 20 of the mobile object 30.

The light-emitting device 10 according to the present example has a configuration described in the embodiment or any of Examples 1 to 5. However, the surface of the light-emitting device 10 on the side opposite to the partition member 20 serves as the light extraction surface. In order to achieve such a configuration, it is necessary to change the light-emitting device 10 to a top emission light-emitting device or to cause the second surface 100b of the light-emitting device 10 to face the partition member 20.

In order to change the light-emitting device 10 to a top emission light-emitting device, the materials of the first electrode 110 and the second electrode 130 may be exchanged. In other words, in this example, the second electrode 130 is formed using a light-transmitting material. On the other hand, the first electrode 110 is preferably formed using a material, such as a metal, having light shielding properties.

Also in the present example, the same as the embodiment, a person inside the mobile object 30 can visually recognize the outside of the mobile object 30 through the light-emitting device 10 and the partition member 20. In addition, light from the light-emitting device 10 is emitted directly to the outside of the mobile object 30 without being transmitted through the partition member 20. Thus, compared to the embodiment, a person outside the mobile object 30 can easily recognize the light from the light-emitting device 10. In addition, since the light-emitting device 10 is mounted on the outside of the mobile object 30, that is, the light-emitting device 10 is mounted on the second surface 24 side of the partition member 20, it is possible to inhibit light emission of the light-emitting device 10 from reflecting on the partition member 20 and entering the interior of the mobile object 30.

Example 7

Figure 14:
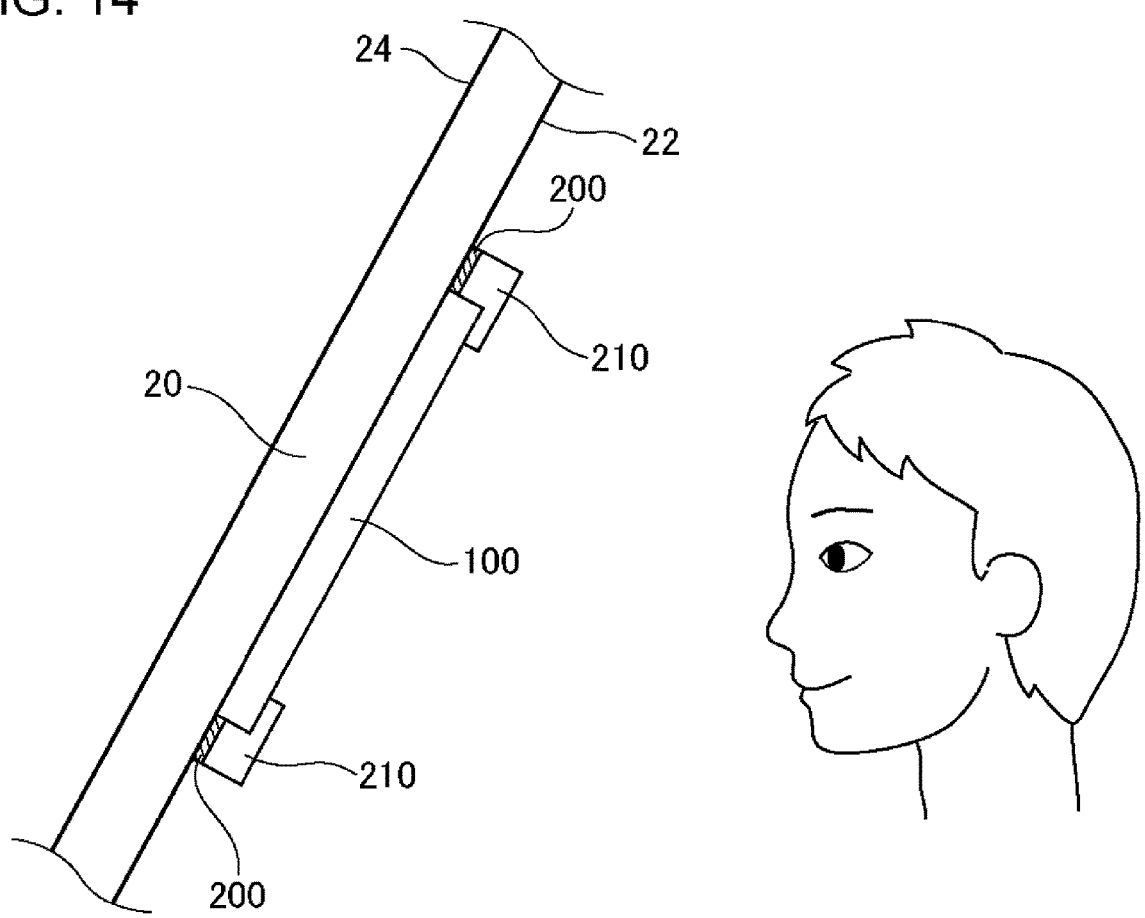
FIG. 14 is a cross-sectional view of a configuration of a light-emitting system according to Example 7.

FIG. 14 is a cross-sectional view of a configuration of a light-emitting system according to Example 7, and corresponds to FIG. 1 of the embodiment. The light-emitting system according to the present example has the same configuration as that of the light-emitting system according to the embodiment, except that the light-emitting device 10 is fixed to the partition member 20 using a fixing member 210. However, the light-emitting device 10 may include any of configurations of Examples 1 to 5.

The fixing member 210 is a frame-shaped member, and a lower surface thereof is fixed to the partition member 20 using an adhesive layer 200. An upper portion of the fixing member 210 is bent toward the inner side of the fixing member 210, and this bent portion holds an edge of the light-emitting device 10. However, the shape of the fixing member 210 is not limited to the example illustrated in the present drawing.

Also in the present example, the same as the embodiment, a person inside the mobile object 30 can visually recognize the outside of the mobile object 30 through the light-emitting device 10 and the partition member 20.

Figure 15:
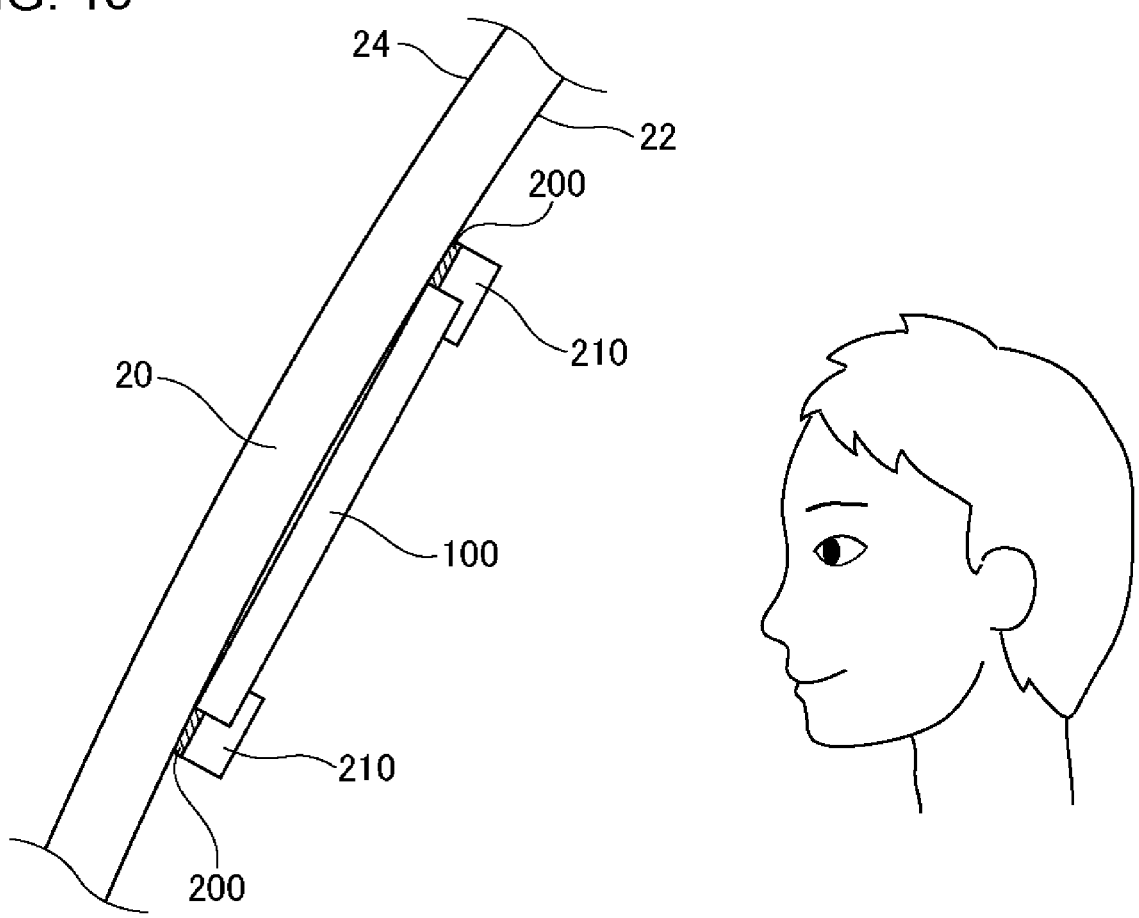
FIG. 15 is a cross-sectional view of a modification example of FIG. 14.

In addition, as illustrated in FIG. 15, there is a case where the partition member 20 is curved in a direction projecting to the outside of the mobile object 30. In such a case, it is difficult to directly fix the flat plate-like light-emitting device 10 on the inner surface (a first surface 22) of the partition member 20. However, when the fixing member 210 is used, even in such a case, the light-emitting device 10 can be fixed on the first surface 22.

In a case where a curved partition member 20 and the flat plate-like light-emitting device 10 are directly fixed by the above method, a filler may be filled in a gap between the partition member 20 and the light-emitting device 10. As mentioned above, the reason for filling a gap with a filler is that if there is a gap, light emitted from the light-emitting device 10 is reflected on the partition member 20, and the reflected light is transmitted to the interior of the light-emitting device 10 via the second region 104 and the third region 106. In a case where refractive indexes of the partition member 20 and the substrate 100 of the light-emitting device 10 are substantially the same as each other (for example, in a case where both are formed by glass), the refractive index of the filler is preferably the same as, or a close value to the refractive indexes of the partition member 20 and the substrate 100. In addition, in a case where the refractive indexes of the partition member 20 and the substrate 100 are different from each other (for example, when the partition member 20 is formed of plastic and the substrate 100 is formed of glass), the refractive index of the filler is preferably a value between the refractive indexes of the partition member 20 and the substrate 100 of the light-emitting device 10.

In addition, other than the light-emitting system of the example above, a unit as a light-emitting module composed of the light-emitting device 10 and the adhesive layer 200 or a light-emitting module composed of the light-emitting device 10 and the fixing member 210 may be used.

Example 8

Figure 16:
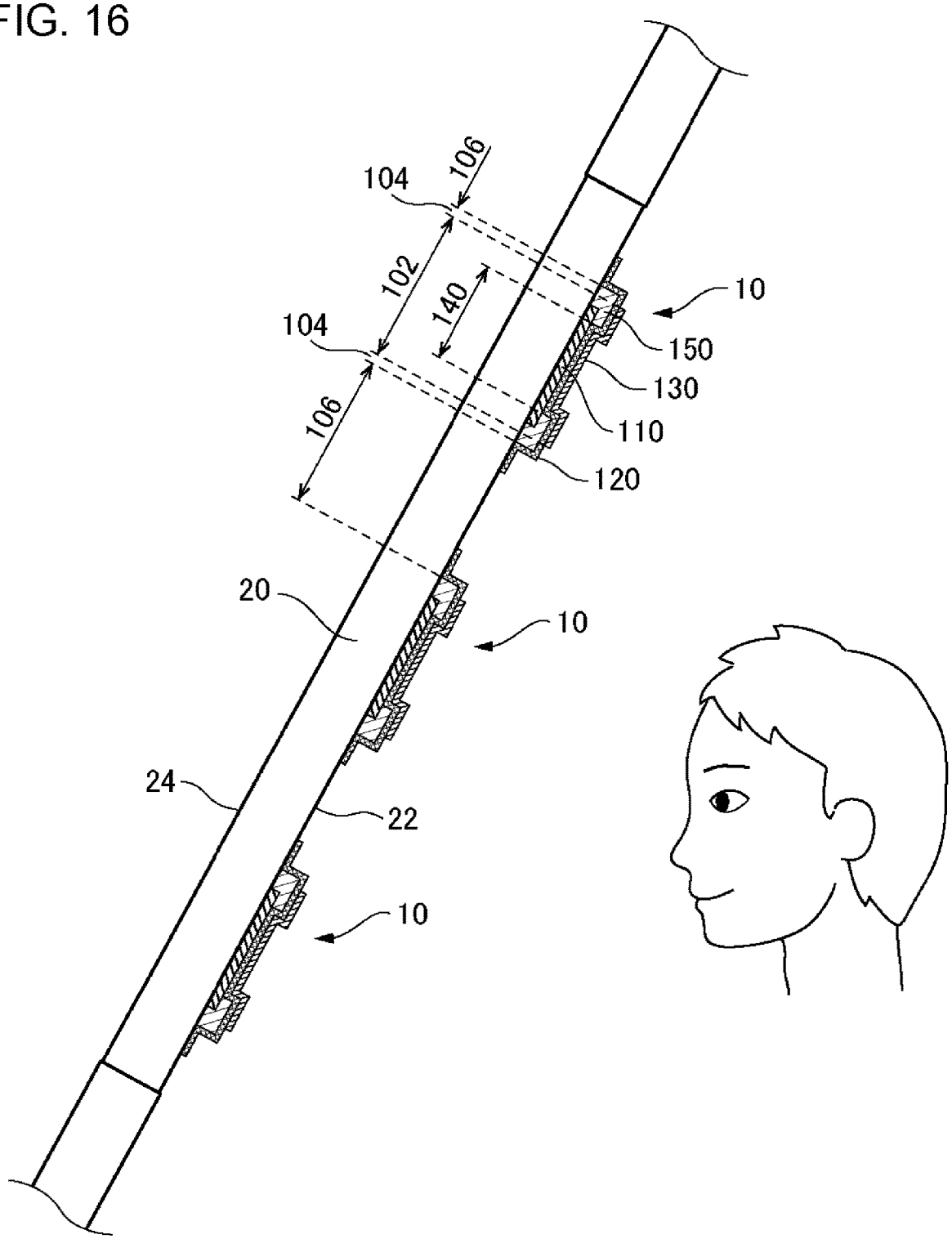
FIG. 16 is a cross-sectional view of a configuration of a light-emitting system according to Example 8.

FIG. 16 is a cross-sectional view of a configuration of a light-emitting system according to Example 8. The light-emitting system according to the present example has the same configuration as that of the light-emitting system according to the embodiment, except that the light-emitting units 140 are formed on the first surface 22 or the second surface 24 of the partition member 20. In other words, in the present example, the partition member 20 also functions as the substrate 100 according to the embodiment. The light-emitting device 10 may include any configuration according to Examples 1 to 5.

Meanwhile, in the present example, a concave portion may be formed in the partition member 20 on a surface on which the light-emitting units 140 are formed, and the light-emitting units 140 may be formed in the concave portion. For example, one concave portion may be formed in a region in which a plurality of the light-emitting units 140 are formed, and the plurality of light-emitting units 140 may be formed on the bottom surface of the one concave portion; or individual concave portions may be formed for each of the plurality of light-emitting units 140. In this case, sealing of the light-emitting unit 140 may be configured to seal the plurality of concave portions at once by a highly optically transparent configuration, for example, by film sealing. In either case of forming individual concave portions for each light-emitting unit 140 and forming one concave portion for a plurality of light-emitting units 140, the light-emitting unit 140 is inhibited from projecting from the partition member 20. Meanwhile, in a case where the light-emitting units 140 are formed in the concave portion of the partition member 20, upper parts of the light-emitting units 140 may be projected from the first surface 22 (or the second surface 24) of the partition member 20, or the light-emitting units 140 may be located entirely below the first surface 22 (or the second surface 24).

Also in the present example, the same as the embodiment, a person inside the mobile object 30 can visually recognize the outside of the mobile object 30 through the light-emitting device 10 and the partition member 20. In addition, since the light-emitting system does not include a substrate 100, the manufacturing cost of the light-emitting system is reduced.

Example 9

Figure 17:
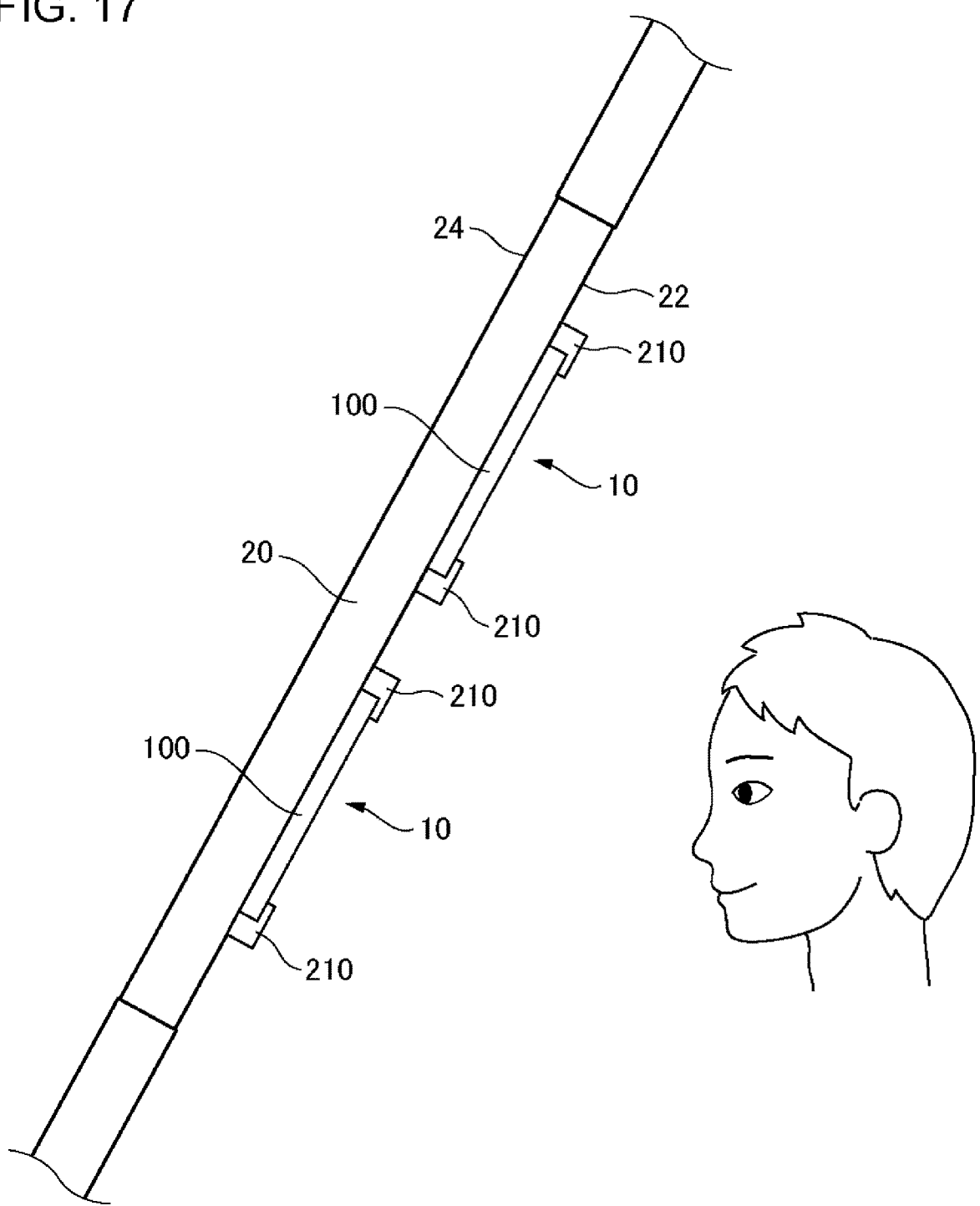
FIG. 17 is a cross-sectional view of a configuration of a light-emitting system according to Example 9.

FIG. 17 is a cross-sectional view of a configuration of a light-emitting system according to Example 9. The light-emitting system according to the example has the same configuration as the embodiment or any of Examples 1 to 8, except that a plurality of light-emitting devices 10 are mounted on the partition member 20. Turning on and off of the lights of the plurality of light-emitting devices 10 may be controlled in accordance with control signals that are the same or different from each other.

Also in the present example, a person inside the mobile object 30 can visually recognize the outside of the mobile object 30 through the light-emitting device 10 and the partition member 20.

The embodiment and the examples are described above referring to the drawings, but these are examples of the present invention and various configurations other than those described above can be employed.

This application claims priority from Japanese Patent Application No. 2015-210775, filed Oct. 27, 2015, the disclosure of which is incorporated by reference in its entirety.

The invention claimed is:

1. A light-emitting system comprising:
a light-emitting device comprising a transmissive portion and a light-emitting unit, the device disposed on a light-transmitting partition member that partitions a first space and a second space,
wherein an intensity of emission into the second space is equal to or greater than 0% and equal to or less than 10% with respect to an intensity of an emission into the first space,
wherein the light-emitting device comprises an insulating film that defines the light-emitting unit, and
wherein the light-emitting system further comprising a semi-transmissive portion between the transmissive portion and the light-emitting unit, the semi-transmissive portion overlapping at least the insulating layer.

2. The light-emitting system according to claim 1, wherein the intensity of emission into the second space is equal to or greater than 0% and equal to or less than 1% with respect to the intensity of emission into the first space.

3. The light-emitting system according to claim 2, wherein the intensity of emission into the second space is equal to or greater than 0% and equal to or less than 0.1% with respect to the intensity of emission into the first space.

4. The light-emitting system according to claim 1, wherein the second space is located inside a mobile object for transporting a person, and
wherein the partition member is a window of the mobile object.

5. A light-emitting system comprising:
a light-transmitting partition member that partitions a first space and a second space;
a light-transmitting substrate disposed on a surface of the partition member on the second space side;
a plurality of light-emitting units disposed on the substrate; and
an insulating film that defines the plurality of light-emitting units,
wherein each light-emitting unit comprises a light-transmitting first electrode, a light-emitting layer, and a second electrode, in order from the first space side, and
wherein the light-emitting system further comprising a light-transmitting region in the substrate between two light-emitting units next to each other as a region in which the insulating film and the second electrode are not formed.

6. The light-emitting system according to claim 5, wherein the substrate is fixed to the partition member using an adhesive layer.

7. The light-emitting system according to claim 5, wherein the substrate is fixed to the partition member using a fixing member.

8. The light-emitting system according to claim 5, wherein, in each light-emitting unit, a portion of the second electrode overlaps the insulating film, and
wherein the substrate comprises a first region overlapping the second electrode, a second region overlapping the insulating film and not overlapping the second electrode, and the light-transmitting region.

9. The light-emitting system according to claim 8, wherein a width of the second region is narrower than a width of the light-transmitting region.

10. The light-emitting system according to claim 5, wherein the light-emitting layer is an organic layer.

11. The light-emitting system according to claim 5, wherein the second space is located inside a mobile object for transporting a person, and
wherein the partition member is a window of the mobile object.

12. A light-emitting system comprising:
a light-transmitting partition member that partitions a first space and a second space;
a plurality of light-emitting units formed on the partition member; and
an insulating film that defines the plurality of light-emitting units,
wherein each light-emitting unit comprises a light-transmitting first electrode, a light-emitting layer, and a second electrode in order from the first space side, and
wherein the light-emitting system further comprising a light-transmitting region in the partition member between two light-emitting units next to each other as a region in which the insulating film and the second electrode are not formed.

13. The light-emitting system according to claim 12, wherein in each light-emitting unit, a portion of the second electrode overlaps the insulating film, and
wherein the partition member comprises a first region overlapping the second electrode, a second region overlapping the insulating film and not overlapping the second electrode, and the light-transmitting region.

14. The light-emitting system according to claim 13, wherein a width of the second region is narrower than a width of the light-transmitting region.

15. The light-emitting system according to claim 12, wherein the light-emitting layer is an organic layer.

16. The light-emitting system according to claim 12, wherein the second space is located inside a mobile object for transporting a person, and
wherein the partition member is a window of the mobile object.

17. A light-emitting system comprising:
a light-emitting device comprising a transmissive portion and a light-emitting unit, the device disposed on a light-transmitting partition member that partitions a first space and a second space,
wherein an intensity of emission into the second space is equal to or greater than 0% and equal to or less than 10% with respect to an intensity of an emission into the first space,
wherein the second space is located inside a mobile object for transporting a person, and
wherein the partition member is a window of the mobile object.

18. The light-emitting system according to claim 17, wherein the mobile object is a vehicle for transporting a person.

19. The light-emitting system according to claim 17, wherein the window is one of a front windshield mobile object, a rear windshield mobile object, and a side window positioned at a side of a seat of the mobile object.

* * * * *